(12) United States Patent
Sharma et al.

(10) Patent No.: US 11,250,899 B2
(45) Date of Patent: Feb. 15, 2022

(54) 1S-1T FERROELECTRIC MEMORY

(71) Applicant: INTEL CORPORATION, Santa Clara, CA (US)

(72) Inventors: Abhishek A. Sharma, Hillsboro, OR (US); Brian S. Doyle, Portland, OR (US); Ravi Pillarisetty, Portland, OR (US); Prashant Majhi, San Jose, CA (US); Elijah V. Karpov, Portland, OR (US)

(73) Assignee: Intel Corporation, Santa Clara, CA (US)

(\*) Notice: Subject to any disclaimer, the term of this patent is extended or adjusted under 35 U.S.C. 154(b) by 0 days.

(21) Appl. No.: 16/633,060

(22) PCT Filed: Sep. 29, 2017

(86) PCT No.: PCT/US2017/054324
§ 371 (c)(1),
(2) Date: Jan. 22, 2020

(87) PCT Pub. No.: WO2019/066904
PCT Pub. Date: Apr. 4, 2019

(65) Prior Publication Data
US 2020/0234750 A1     Jul. 23, 2020

(51) Int. Cl.
*G11C 11/22*    (2006.01)
*H01L 27/11585*    (2017.01)

(52) U.S. Cl.
CPC ...... *G11C 11/2259* (2013.01); *G11C 11/2273* (2013.01); *G11C 11/2275* (2013.01); *H01L 27/11585* (2013.01)

(58) Field of Classification Search
CPC .................................................. G11C 11/223
(Continued)

(56) References Cited

U.S. PATENT DOCUMENTS

| | | | | |
|---|---|---|---|---|
| 5,563,081 A | \* | 10/1996 | Ozawa | ............ G11C 11/22 438/3 |
| 2013/0003439 A1 | \* | 1/2013 | Azuma | ............ G11C 13/004 365/148 |

(Continued)

FOREIGN PATENT DOCUMENTS

| | | |
|---|---|---|
| JP | H06224384 A | 8/1994 |
| JP | 2001237386 A | 8/2001 |

(Continued)

OTHER PUBLICATIONS

International Search Report and Written Opinion received for PCT Application No. PCT/US2017/054324 dated Jun. 26, 2018. 14 pages.

(Continued)

*Primary Examiner* — Hoai V Ho
(74) *Attorney, Agent, or Firm* — Schwabe, Williamson & Wyatt, P.C.

(57) ABSTRACT

A 1S-1T ferroelectric memory cell is provided that include a transistor and a two-terminal selector device. The transistor exhibits a low conductive state and a high conductive state (channel resistance), depending on drive voltage. The two-terminal selector device exhibits one of an ON-state and an OFF-state depending upon whether the transistor is in its low conductive state or its high conductive state. The transistor may be, for instance, a ferroelectric gate vertical transistor. Modulation of a polarization state of ferroelectric material of the vertical transistor may be utilized to switch the state of the selector device. The memory cell may thus selectively be operated in one of an ON-state and an OFF-state depending upon whether the selector device is in its ON-state or OFF-state.

20 Claims, 19 Drawing Sheets

(58) Field of Classification Search
USPC .......................................................... 365/145
See application file for complete search history.

(56) References Cited

U.S. PATENT DOCUMENTS

2017/0162702 A1\*  6/2017  Hu ........................ H01L 29/775
2019/0058006 A1\*  2/2019  Karpov .................. H01L 45/04

FOREIGN PATENT DOCUMENTS

| KR | 1020090044304 | 5/2009 |
| KR | 101113885 B1 | 3/2012 |
| WO | 2019066904 A1 | 4/2019 |

OTHER PUBLICATIONS

Katsouras, et al., "Controlling the on/off current ratio of ferroelectric field-effect transistors," Scientific Reports, published Jul. 10, 2015. 8 pages.

International Preliminary Report on Patentability received for PCT Application No. PCT/US2017/054324, dated Apr. 9, 2020. 11 pages.

\* cited by examiner

1S-1T FERROELECTRIC MEMORY

CROSS REFERENCE TO RELATED APPLICATIONS

This application is a U.S. national stage entry under 35 U.S.C. § 371(c) of International Application No. PCT/US17/54324, filed Sep. 29, 2017, the disclosure of which is incorporated by reference herein in its entirety.

BACKGROUND eDRAM ("Enhanced Dynamic Random Access Memory") and eSRAM ("Enhanced Static Random Access Memory") consume a significant area because they are transistor pitch limited. It is desirable to conserve area, especially in the front-end. For this reason, vertical transistors may be employed. Thus, in order to build compact memory structures, it is desirable to leverage a physical property that is suitable for such structures.

Ferroelectricity is a property of certain materials that have a spontaneous electric polarization that can be reversed by the application of an external electric field. The term is used in analogy to ferromagnetism, in which a material exhibits a permanent magnetic moment. Ferroelectric materials exhibit a hysteresis effect, which allows for switching between two polarized states.

Typically, ferroelectric materials are made of oxide. An analogy can be found between the electric properties of ferroelectrics and the magnetic properties of ferromagnets. However, while mechanical coupling can be neglected in ferromagnets this is not the case for ferroelectrics. Ferroelectricity arises because of strain and displacement of charge. While ferromagnetism is a reordering of the spin states of the electrons.

Ferroelectric materials may comprise a lattice that may assume multiple states. For example, a ferroelectric material may be switched between a parallel and anti-parallel polarization state. Ferroelectric materials may also operate as a dielectric. A ferroelectric capacitor is a capacitor based on a ferroelectric material. In contrast, traditional capacitors are based on dielectric materials. Ferroelectric devices have been used in digital electronics as part of ferroelectric RAM, or in analog electronics as tunable capacitors (varactors). Thus, any change in polarization of ferroelectric a ferroelectric material may effectively cause a change in the capacitance.

The nonlinear nature of ferroelectric materials can be used to make capacitors with tunable capacitance. Typically, a ferroelectric capacitor simply consists of a pair of electrodes sandwiching a layer of ferroelectric material. The permittivity of ferroelectrics is not only tunable but commonly also very high in absolute value, especially when close to the phase transition temperature. Because of this, ferroelectric capacitors are small in physical size compared to dielectric (non-tunable) capacitors of similar capacitance.

The spontaneous polarization of ferroelectric materials implies a hysteresis effect which can be used as a memory function, and ferroelectric capacitors are have been used to make ferroelectric RAM ("Random Access Memory") for computers and RFID ("Radio Frequency Identification") cards. In these applications, thin films of ferroelectric materials are typically used as this allows the field required to switch the polarization to be achieved with a moderate voltage.

If the ferroelectric is coupled to a semiconductor such as a FET ("Field Effect Transistor"), changing the gate capacitance will cause a change in the conductivity between the source and drain of the semiconductor (channel).

DETAILED DESCRIPTION

The present disclosure describes a 1S-1T compact ferroelectric memory cell ("1S-1T CFMC") that provides significant advantages over conventional memory cells, according to some embodiments. Among other features, the 1S-1T CFMC provides a non-disturbing read, 4× reduction in 4F2 area compared with state-of-the-art devices, backend transistor fabrication with array efficiency, according to some embodiments. The term 1S-1T refers to the use of one transistor and one selector device (described below). Numerous configurations and embodiments will be appreciated in light of this disclosure.

Figure 1:
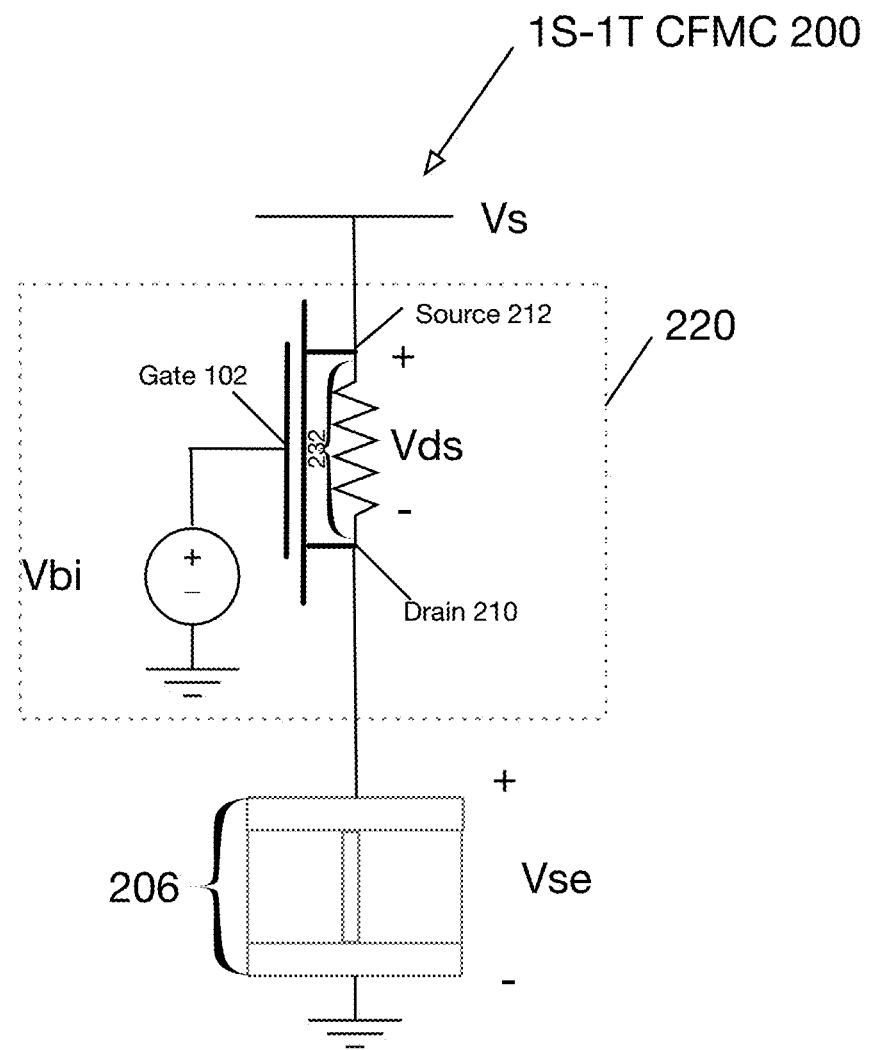
FIG. 1 is a schematic of a 1S-1T compact ferroelectric memory cell ("1S-1T CFMC") according to one embodiment of the present disclosure.

FIG. 1 is a schematic of a 1S-1T compact ferroelectric memory cell according to one embodiment of the present disclosure. As shown in FIG. 1, 1S-1T CFMC 200 further comprises ferroelectric gate vertical transistor ("FGVT") 220 and selector device 206. Selector device 206 may be any device that exhibits a voltage-dependent volatile resistance state change (described below). As FGVT 220 employs a ferroelectric gate material between gate 102 and channel 232 (source 212 to drain 210 region), a persistent built-in voltage/built-in charge may be established at gate 102 of FGVT 220 by establishing one of two possible polarization states (parallel or anti-parallel) in the ferroelectric gate material. The polarization state of FGVT 220 may be controlled by driving gate 102 with either a large positive coercive voltage or large negative voltage to establish a respective positive built-in voltage $V_{bi}$ or negative built-in voltage $V_{bi}$. The built-in voltage $V_{bi}$ is persistent due to the hysteresis behavior of ferroelectric materials and is associated with a built-in charge $Q_{bi}$. This persistent built-in voltage/charge $V_{bi}/Q_{bi}$ controls the conductivity across the source 212 to drain 210 region (channel 232) based upon an effective threshold voltage $V_t$ of FGVT 220. That is, the persistent $V_{bi}/Q_{bi}$ at gate 102 of FGVT 220 modulates the threshold voltage $V_t$ of CFMC 220 to generate an effective threshold voltage $V_{t\text{-}eff}$ at FGVT 220. This $V_{t\text{-}eff}$ may cause FGVT 220 to be on (source-drain highly conductive) even at zero bias or off depending respectively whether $V_{bi}>0$ or $V_{bi}<0$.

Channel 232 may either be N-type material or P-type material. In embodiments, channel 232 may be an N-type channel material or a P-type channel material. An N-type channel material may include indium tin oxide (ITO), indium gallium zinc oxide (IGZO), indium zinc oxide (IZO), aluminum-doped zinc oxide (AZO), amorphous silicon, zinc oxide, amorphous germanium, polysilicon, poly germanium, or poly-III-V like indium arsenide (InAs). On the other hand, a P-type channel material may include amorphous silicon, zinc oxide, amorphous germanium, polysilicon, poly germanium, poly-III-V like InAs, copper oxide (CuO), or tin oxide (SnO). Channel 232 may have a thickness in a range of about 10 nm to about 100 nm. In addition to these, FGVT 220 may be a single crystal variant of any of these materials listed above.

Due to the voltage divider between FGVT 220 and selector device 206 (where FGVT 220 provides one resistance of the divider and selector device 206 provides another resistance of the voltage divider), one of two states (ON-state or OFF-state) of selector device 206 may be selected depending upon whether channel 232 of FGVT 220 is in a low or high conductive state. In particular, if channel 232 of FGVT 220 is highly conductive, most of $V_2$ falls across selector device 206 causing it to be in an ON-state. On the other hand, if the channel 232 of FGVT 220 is highly resistive, most of the voltage falls across FGVT 220 causing selector device 206 to be in an OFF-state.

During a write operation (described in detail below), a shift in $V_t$ of FGVT 220 ($V_{t\text{-}eff}$) is achieved by applying a large positive or negative voltage at gate 102 of FGVT 220. The write may be a 2 terminal non-volatile write. During a read operation (described in detail below), the shift of $V_t$ to $V_{t\text{-}eff}$ of FGVT 220 will cause a $V_t$ shift at selector device 206. Thus, applying a large positive voltage or a large negative voltage at gate 102 of 1S-1T CFMC will either switch selector device 206 to an ON-state or an OFF-state respectively.

Figure 2A:
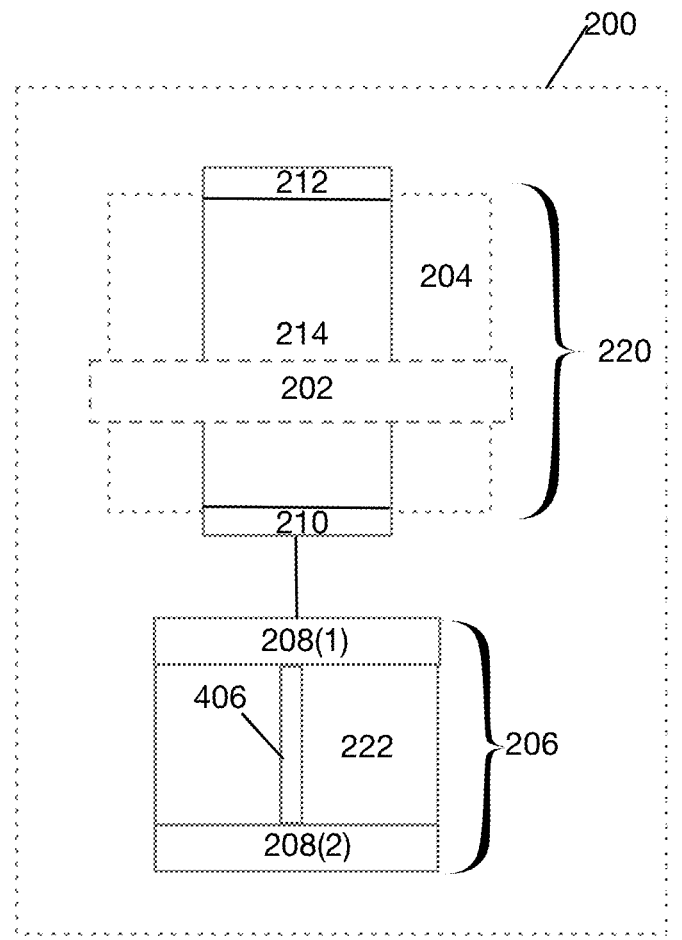
FIG. 2a a is a cross-sectional view of a 1S-1T CFMC according to one embodiment of the present disclosure.

FIG. 2a is a cross-sectional view of a 1S-1T CFMC according to one embodiment of the present disclosure. As shown in FIG. 2a, 1S-1T CFMC 200 may further comprise FGVT 220 and selector device 206. FGVT 220 may further comprise gate oxide 202, ferroelectric layer 204, semiconductor 214, source 212 and drain 210. The structure and function of selector device 206 will be described below with respect to FIG. 4. For purposes of the present discussion, it is sufficient to recognize that selector device 206 may be a 2-terminal device that exhibits a voltage-dependent volatile resistance state change.

According to one embodiment of the present disclosure, FGVT 220 may further comprise gate oxide 202, drain 210, source 212 and semiconductor 214. FGVT 220 may assume a cylindrical form in which gate oxide 202 comprises an outer layer of the cylindrical form wrapping ferroelectric layer 204, which further wraps semiconductor 214.

According to one embodiment of the present disclosure, FGVT 220 may be a vertical nanowire surround-gate field-effect transistor ("VS-FET") that is modified to include ferroelectric layer 204 fabricated beneath gate oxide 202. As will become evident, ferroelectric layer 204 may operate as tunable capacitor, which may be tuned to achieve a desired capacitance by causing the electric polarization associated with ferroelectric layer 204 to assume a desired polarization state (e.g., parallel or anti-parallel). In this regard, ferroelectric layer 204 operates as a dielectric, in which case a built-in voltage and associated built-in charge may be established. The established built-in voltage may cause FGVT 220 to operate in either an ON-state or OFF-state. The OFF-state is associated with a high resistance between source 212 and drain 210 while the ON-state is associated with a low resistance between source 212 and drain 210.

According to one embodiment of the present disclosure, ferroelectric layer 204(a)-204(b) is associated with a capacitance that may be tuned by controlling the electric polarization of ferroelectric layer 204(a)-204(b). For example, as discussed below, the electric polarization of ferroelectric layer 204(a)-204(b) may be controlled to be either in one of a parallel or anti-parallel electric state. Each of these electric polarizations induces a respective built-in voltage and/or built-in charge $V_{bi}/Q_{bi}$ in gate oxide 202(a)-202(b). Thus, by controlling the electric polarization of ferroelectric layer 204(a)-204(b) to be in one of a parallel or anti-parallel state, the threshold voltage $V_t$ of FGVT 220 may be modulated to $V_{t\text{-}eff}$ to be either in a first threshold voltage $V_{t\text{-}ON}$ or a second threshold voltage $V_{t\text{-}OFF}$. $V_{t\text{-}ON}$ means $V_{t\text{-}eff}$ is modulated to such extent that FGVT 220 is on even at 0 bias while $V_{t\text{-}ON}$ means $V_{t\text{-}eff}$ is off at 0 bias.

Figure 2B:
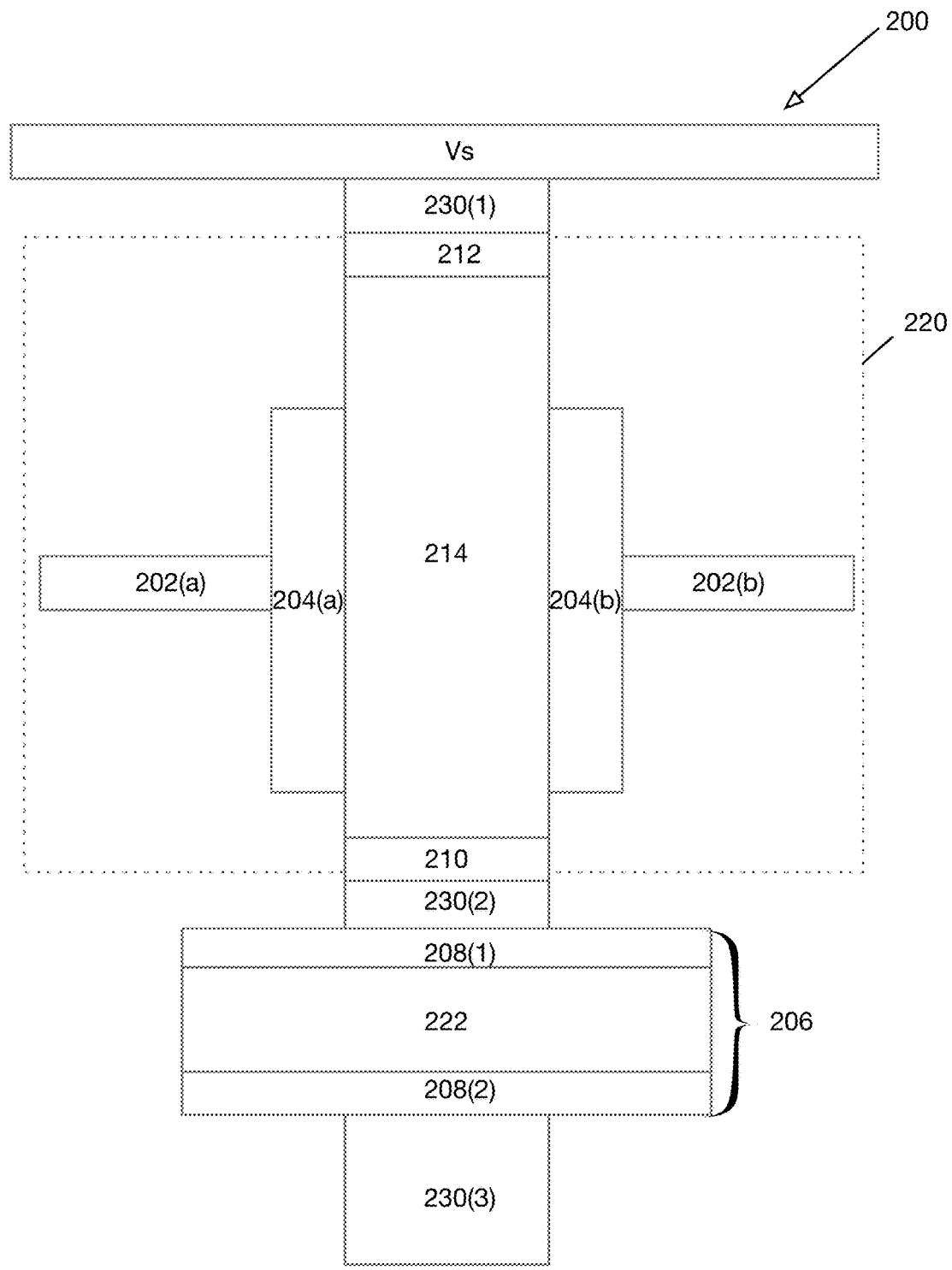
FIG. 2b is a more detailed cross-sectional view of a 1S-1T CFMC according to one embodiment of the present disclosure.

FIG. 2b is a more detailed cross-sectional view of a 1S-1T CFMC 200 according to one embodiment of the present disclosure. As shown in FIG. 2b, 1S-1T CFMC 200 further comprises FGVT 220. FGVT 220 may be similar in architecture a VS-FET. As shown in FIG. 2b, FGVT 220 may further comprise gate oxide 202(a)-202(b), source 212 and drain 210, ferroelectric layer 204(a)-204(b) and semiconductor 214. As FIG. 2b is a cross-sectional view, it will be understood that gate oxide 202(a)-202(b) wraps ferroelectric layer 204(a)-204(b). Ferroelectric layer 204(a)-204(b) in turns wraps semiconductor 214. Semiconductor 214 is electrically coupled to drain 210 and source 212.

FGVT 220 is coupled via source 212 to voltage source $V_s$ via metal 230(1). FGVT 220 is coupled to selector device 206 via drain 210 via metal 230(2).

Figure 3A:
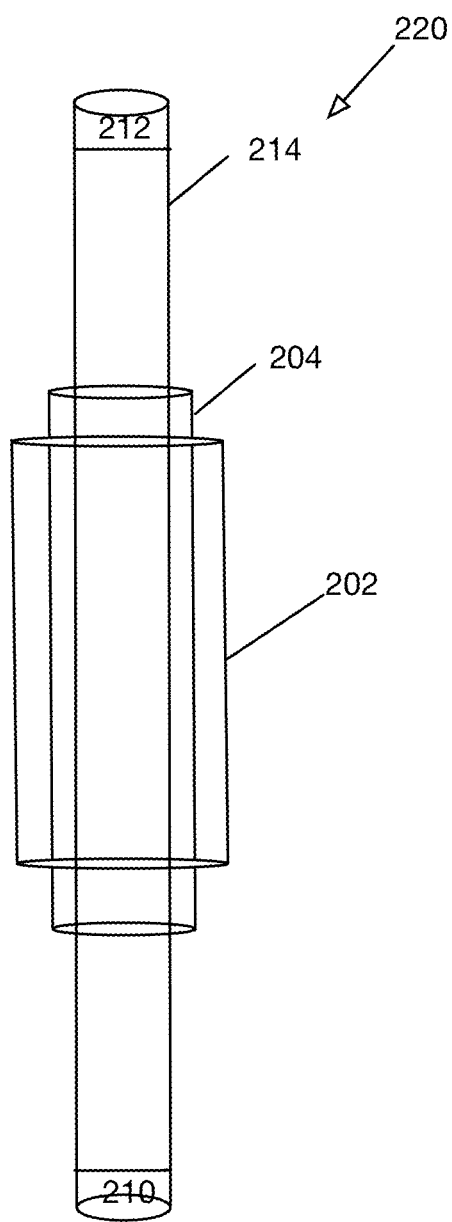
FIG. 3a depicts a detailed structure of a FGVT according to one embodiment of the present disclosure.

FIG. 3a depicts a detailed structure of a FGVT according to one embodiment of the present disclosure. As shown in FIG. 3a, gate oxide 202 wraps ferroelectric layer 204. Ferroelectric layer 204 in turns wraps semiconductor 214. Semiconductor 214 is electrically coupled to drain 210 and source 212.

The operation of FGVT 220 with respect to the present disclosure will now be described. First, a simplified view of operation of a VS-FET is described (i.e., a vertical surround gate FET absent ferroelectric material 204). A VS-FET may operate in a similar manner to a MOSFET ("Metal Oxide Semiconductor Field Effect Transistor"). When a voltage is applied between the gate 102 and body terminals, an electric field generated penetrates through the oxide and creates an "inversion layer" or "channel" 232 at the semiconductor-insulator interface (in semiconductor 214). The inversion layer provides a channel 232 through which current can pass between source 212 and drain 210 terminals. Varying the voltage between the gate 102 and body modulates the conductivity of this layer and thereby controls the current flow between drain 210 and source 212. This is known as enhancement mode.

When the VS-FET is in cutoff mode, the resistance between source 212 and drain 210 is extremely high. When the VS-FET's gate-to-source voltage ($V_{GS}$) exceeds a threshold voltage ($V_t$), it is in an "on state," and the drain and source are connected by channel 232 with resistance equal to $R_{DS}$(on), which is a low resistance. On the other hand, when the VS-FET's gate-to-source voltage ($V_{GS}$) falls below the threshold voltage ($V_t$), it is in an "off state," and the drain and source are connected by channel 232 with resistance equal to $R_{DS}$(off), which is a high resistance.

Thus, current flow from drain 210 to source 212 may be controlled by application of a voltage at gate 102 which is coupled to gate oxide 202, which further surrounds ferroelectric layer 204(a)-204(b) and semiconductor 214.

FGVT 220 differs in structure from a VS-FET by virtue of the introduction of ferroelectric material layer 204 between gate oxide 202 and semiconductor 214. While ferroelectric layer 204 may assume a continuum of polarization states, as will be described below, ferroelectric layer 204 may be induced to assume two discrete particular polarization state a parallel polarization state and an anti-parallel polarization state. When ferroelectric layer 204 is placed in either the parallel electric polarization state or the anti-parallel electric polarization state, an associated built-in voltage and built-in charge is induced in gate oxide 202. This induced built-in voltage/built-in charge in gate oxide 202 modulates the $V_t$ of FGVT 220, modifying the conductivity of the source to drain region (channel 232). Due to a voltage divider effect between the source to drain region of FGVT 220 and selector device, depending upon whether the source to drain region (channel 232) is highly conductive or highly resistive, selector device 206 will be in an ON-state or an OFF-state.

The electric polarization behavior of ferroelectric layer 204 will now be described. A dielectric is a medium that cannot completely screen a static, external, macroscopic electric field from its interior. This property of incomplete screening is a consequence of chemical bonding and other quantum mechanical effects which constrain the rearrangement of its internal charge density when an external field is applied. Similar to a conductor, a dielectric response to an external by distorting its ground state charge density to reduce the field. The total electric field is the sum of these two fields. Unlike a conductor, the total macroscopic field is nonzero both inside and outside the volume of the dielectric:

$$E_{tot}(r)=E_{self}(r)+E_{ext}(r)$$

The source of $E_{self}(r)$ is referred to his bound charge or polarization charge $\rho_p(r)$. The macroscopic charge density $\rho(r)$ is zero at every point inside a when $E_{EXT}$=0. When $E_{EXT}$ is introduced, positive charges push in one direction a negative charge in the other. Charge rearrangement continues until mechanical equilibrium is reestablished and $\rho_p(r)$ is induced as a macroscopic charge density that makes the Coulomb force density $\rho_p(r)E_{EXT}(r)$ equal and opposite to the force density produced by chemical bonding and other non-electrostatic effects. The total charge density is the sum of the free and bound charge densities:

$$\rho(r)=\rho_f(r)+\rho_p(r)$$

The term polarization refers to a function P(r) characterizing the details of the rearrangement of internal charge when an external field is applied. A neutral dielectric with volume V and surface S remains a neutral dielectric in the presence of free charge of any kind. In that case, the polarization charge density satisfies the constraint:

$$\int_V d^3r\rho_p(r) + \int_S dS\sigma_p(r_s) = 0$$

A neutral conductor satisfies the above equation with $\rho_p(r)=0$ and $\sigma_p(r_s)\neq 0$. A dielectric uses the polarization P(r) to satisfy the above equation with $\rho_p(r)\neq 0$ and $\sigma_p(r_s)\neq 0$. The left side of the above equation is identically zero if the divergence theorem is used after substituting:

$$\rho_p(r)=-\nabla \cdot P(r) r \in V$$

$$\sigma_p(r)=P(r_s)\cdot \hat{n}(r_s) r_s \in S$$

$$P(r)=0 r \notin V$$

Thus, a macroscopic electrostatic field of a dielectric sample is produced by macroscopic polarization charge densities $\rho_p(r)$ and $\sigma_p(r)$. These are determined by the polarization P(r).

It can be shown that the integral of the polarization over the volume of a dielectric is equal to the total dipole moment of the dielectric:

$$\int_V d^3r P(r) = p$$

A material is ferroelectric when it has two distinct polarization states, which can be maintained or persisted in the absence of an electric field and between which one can switch by applying an electric field. The appearance of a hysteresis cycle is essential for ferroelectricity. But not all solids with electrical hysteresis are ferroelectric. Hysteresis can have extrinsic causes due to mobile charge defects and PN-junctions.

The polarization remaining in a material when the polarization field is reduced to zero, is called the remanent polarization. The ability of a material to retain this polarization is called the retentivity or remanence of the material. Therefore, the retentivity or remanence of a material is a measure of the polarization remaining (residual polarization) in the material when the electric field is totally removed. The coercivity of a material is a measure of the strength of the reverse polarizing field E required to wipe out the remanent polarization of the specimen.

A P-E loop for a device is a plot of the charge or polarization developed, against the field applied to that device at a given frequency. For an ideal ferroelectric, the P-E hysteresis loop is symmetric. From the P-E hysteresis loop, the remanent polarization states and the coercive fields may be determined. This coercive field must be lower than the breakdown field of the material, to enable switching.

Figure 3B:
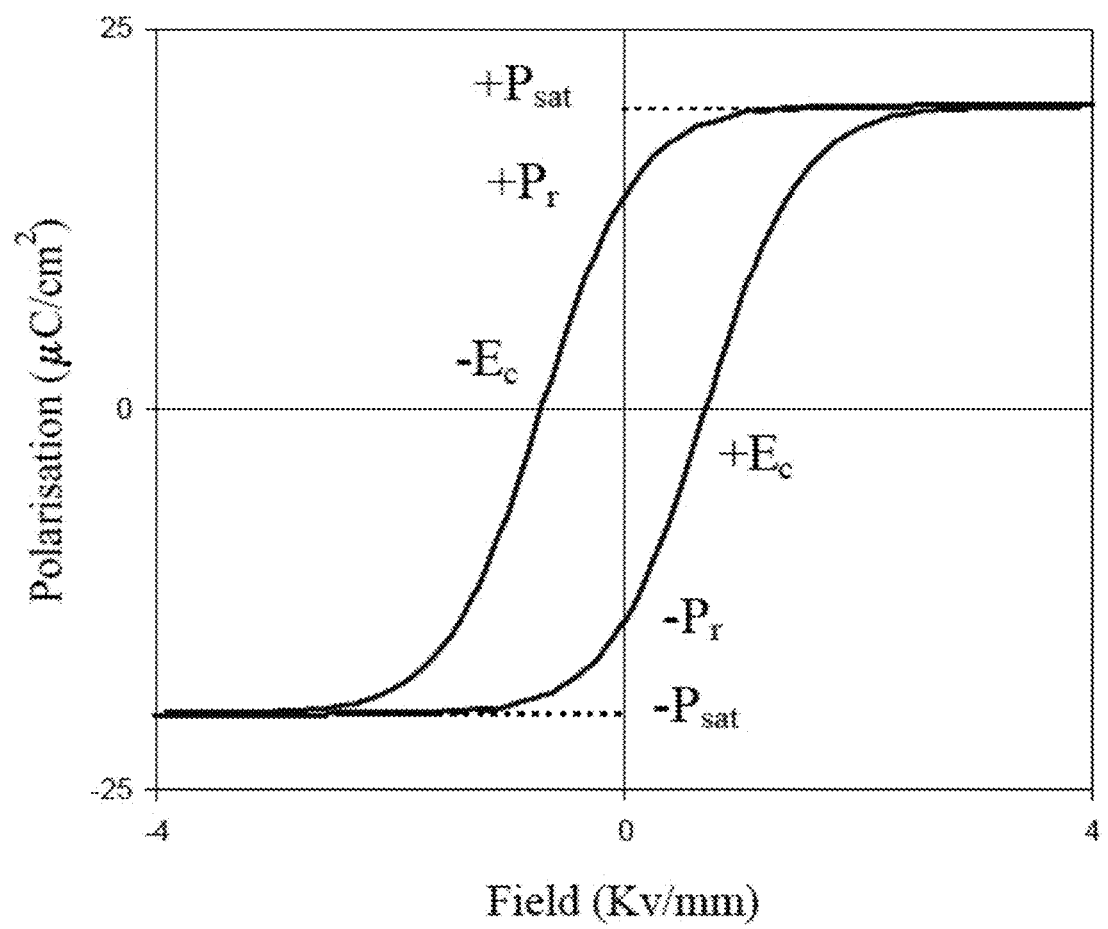
FIG. 3b is a plot of a P-E hysteresis loop parameters for a ferroelectric material according to one embodiment of the present disclosure.

FIG. 3b is a plot of a P-E hysteresis loop parameters for a ferroelectric material according to one embodiment of the present disclosure.

Figure 3C:
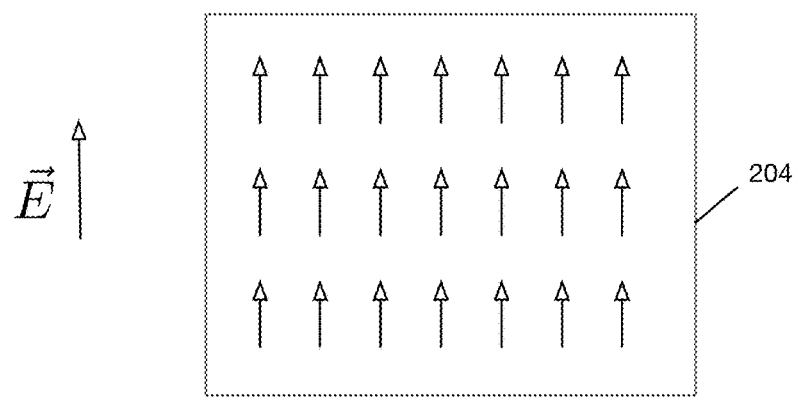
FIG. 3c depicts a polarization of a ferroelectric in a parallel configuration according to one embodiment of the present disclosure.

FIG. 3c depicts a polarization of a ferroelectric in a parallel configuration according to one embodiment of the present disclosure. As shown in FIG. 3a, polarization of ferroelectric layer 204 is in the same direction (parallel) to the applied electric field $\vec{E}$. A parallel polarization state may be induced in ferroelectric layer 204 by applying a large positive voltage (coercive voltage) at gate 102 of FGVT 220.

Figure 3D:
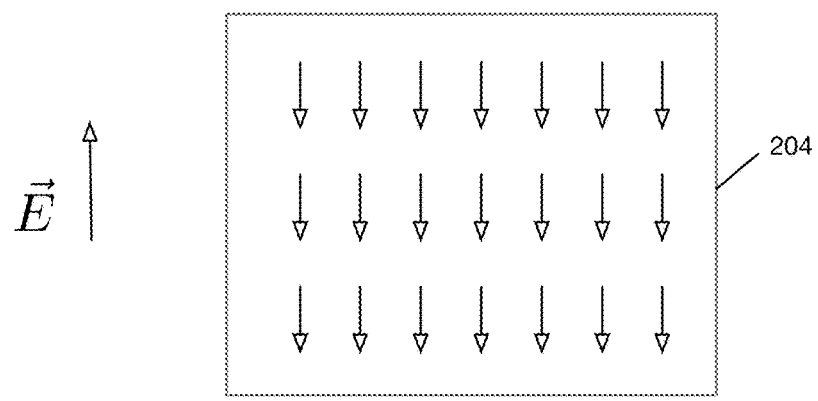
FIG. 3d depicts a polarization of a ferroelectric in an antiparallel configuration according to one embodiment of the present disclosure.

FIG. 3d depicts a polarization of a ferroelectric in an antiparallel configuration according to one embodiment of the present disclosure. As shown in FIG. 3b, polarization of ferroelectric layer 204 is in the opposite direction (antiparallel) of the applied electric field $\vec{E}$. An anti-parallel polarization state may be induced in ferroelectric layer 204 by applying a large negative voltage (coercive voltage) at gate 102 of FGVT 220.

Selector (Threshold Switching Device)

Figure 4:
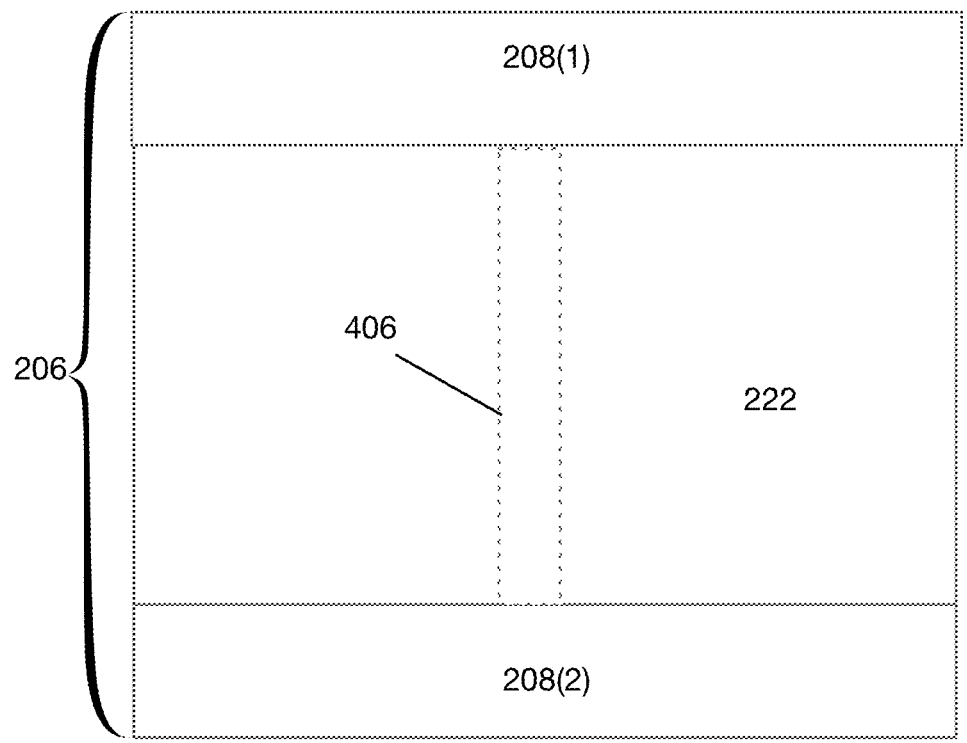
FIG. 4 depicts a structure of a selector device according to one embodiment of the present disclosure.

FIG. 4 depicts a structure of a selector device according to one embodiment of the present disclosure. Selector device 206 may be any 2-terminal device that exhibits a voltage-dependent volatile resistance state change. According to one embodiment of the present disclosure, when a voltage across selector device 206 exceeds a pre-determined value herein referred to as the threshold voltage (not the same threshold voltage $V_t$ associated with CTVT 220), the resistance of selector device 206 is reduced to a very or otherwise relatively low value. Characteristic I-V curves for selector device 206 is described below with respect to FIGS. 5a-5g.

Threshold Voltage, Holding Voltage and Filament

As previously noted, selector device 206 may be any 2-terminal device that shows a voltage dependent volatile resistance state change. Selector device 206 may comprise a resistive random-access memory ("RRAM" or "ReRAM"), which may be any type of non-volatile ("NV") random-access ("RAM") computer memory that operates by changing the resistance across a dielectric solid-state material often referred to as a memristor.

Certain disordered glasses (including polycrystalline films with defects) like chalcogenides and some oxides show a characteristic bistability in their resistance states. Several mechanisms have been advanced to explain this change in conductivity ranging from carrier injection, field-driven nucleation and growth of conducting laments, insulator-metal transitions, and so on. Despite the variety in the physical mechanisms, all of the theories agree that as the voltage across a device composed of such elements is increased, the current through the device undergoes a localization process that is concurrent with a drop in device resistance and is accompanied by a negative differential resistance regime in the device I-V characteristic.

In particular, according to one embodiment of the present disclosure, selector device 206 may comprise a dielectric, which is non-conductive (insulating) in a first state and conductive in a second state. A conductive state may be generated through the formation of a filament 406 or conduction path, which is generated after application of a sufficiently high voltage across selector device 206. Note that filament 406 is shown in FIG. 4 using dotted lines to indicate its transitory nature.

Filament 406 may arise from different mechanisms, including vacancy or metal defect migration. Once filament 406 is formed, it may be reset (broken, resulting in high resistance) or set (re-formed, resulting in lower resistance) by another voltage. The low-resistance path can be either localized (filamentary) or homogeneous. Both effects can occur either throughout the entire distance between the electrodes or only in proximity to one of the electrodes.

According to one embodiment of the present disclosure, when an applied voltage across selector device 206 exceeds a certain value known as a threshold voltage $V_t$, the resistance of selector device 206 is reduced to a low value, which occurs due to the formation of filament 406. This high conductivity (low resistance) state may be maintained so long as the voltage across selector device 206 is higher than a holding voltage $V_h$ (described below). On the other hand, when the voltage across selector device 206 is reduced below $V_h$, the resistance across selector device 206 returns to an insulating or resistive state and filament 406 is dissolved.

Example Selector Materials

According to one embodiment selector device 202 may comprise an oxide/semiconductor 304 sandwiched between a first 302(a) and second 302(b) metal layer. According to alternative embodiment, any other materials that exhibit a volatile resistance state change may be utilized for element 304. For example, other materials that exhibit a volatile resistance state change include niobium dioxide (NbO2), tantalum oxide (TaOx), vanadium dioxide (VO2), nickel oxide (NiO), chalgogenides such as titanium (Ti), tellurium (Te), arsenic (As), germanium (Ge), hafnium tantalum oxide (HfTaOx), hafnium niobium oxide (HfNbOx), hafnium nickel oxide (HfNiOx), niobium tantalum oxide (NbTaOx), and nickel tantalum oxide (NiTaOx). Other comparable or otherwise suitable materials will be apparent in light of this disclosure.

Multiple inorganic and organic material systems display thermal or ionic resistive switching effects. Example materials include phase-change chalcogenides such as germanium-antimony-tellurium (GeTe-Sb2-Te3) or silver-indium-antimony-tellurium (AgInSbTe), binary transition metal oxides such as NiO or titanium oxide (TiO), perovskites such as strontium zirconium titanate (Sr(Zr)TiO3) or PCMO, solid-state electrolytes such as germanium sulfide (GeS), germanium selenide (GeSe), silicon oxide (SiOx), or copper sulfide (Cu2S).

According to one embodiment of the present disclosure, metal layers 208(1)-208(2) may exhibit a thickness of between 2 and 50 nm. Oxide semiconductor layer 222 may exhibit a thickness of between 5-80 nm. In particular, for low voltage applications less than 1.5 volts, oxide semiconductor layer 222 thickness may be between 5-20 nm and for high voltage applications (e.g., 1.5-3.3 volts), oxide semiconductor 222 thickness may be between 20-80 nm.

Figure 5A:
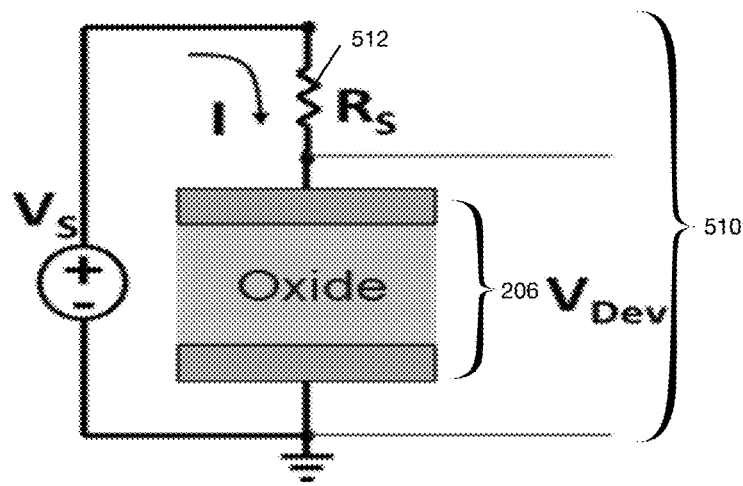
FIG. 5a shows a circuit schematic of a selector device in series with a resistor, according to an embodiment of the present disclosure.

FIG. 5a shows a circuit schematic of a selector device in series with a resistive element, according to an embodiment of the present disclosure. A voltage source $V_s$ may be applied across resistor-selector pair 510. As will be described below, resistor-selector pair 510 further comprising resistor 512 and selector device 206 may exhibit oscillatory or non-oscillatory behavior depending upon a bias voltage (e.g., $V_s$).

Figure 5B:
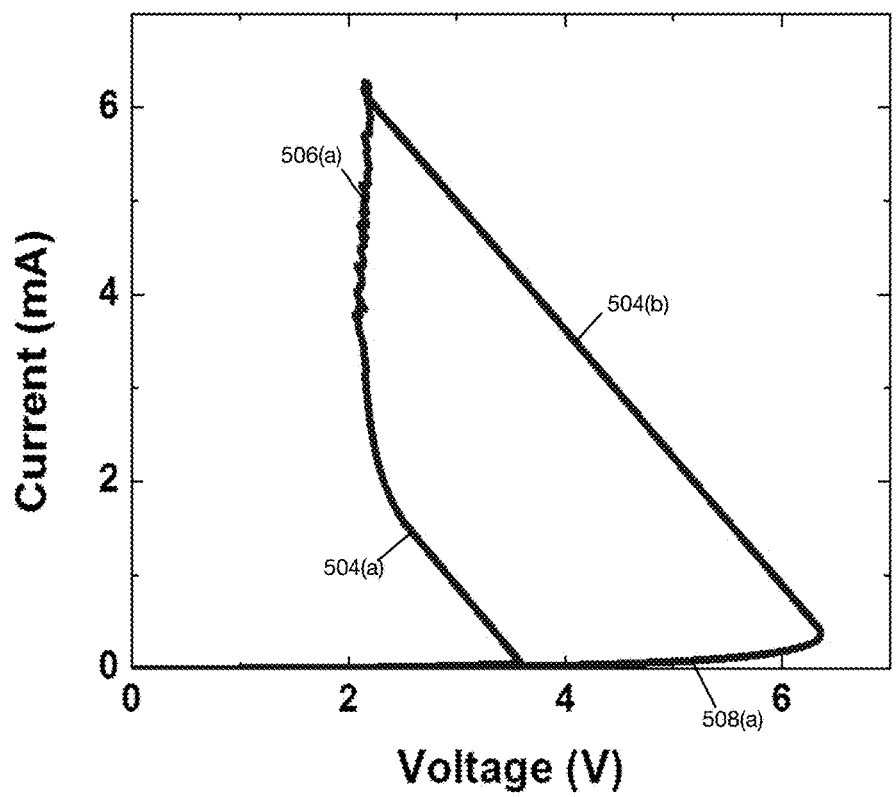
FIG. 5b shows an I-V characteristic of selector device showing a metastable ON-state when stressed with a triangular pulse, according to one embodiment of the present disclosure.

FIG. 5b shows an I-V characteristic of a selector device showing a metastable ON-state when stressed with a triangular pulse, according to one embodiment of the present disclosure. As shown in FIG. 5b, the I-V curve shown may be characterized by four (4) regimes. OFF-state regime 508(a) is a high resistance state (i.e., $$\frac{dV}{dI}$$

is high). ON-state regime 506(a) is a low resistance state (i.e., $$\frac{dV}{dI}$$

is low). Regimes 504(a)-504(b) are negative differential resistance ("NDR") states $$\left(i.e., \frac{dV}{dI} < 0\right).$$

In OFF-state regime 508(a), as the bias across the device-resistance pair 510 (206 and 512) is slowly increased, the current through selector device 206 increases and eventually, at a threshold voltage, selector device 206 enters negative differential resistance regime 504(b). This implies that selector device 206 forms conductive filament 406 (shown in FIG. 4) as it enters negative differential resistance (NDR) and this abrupt reduction in resistance induced by the formation of conductive filament 406 is responsible for the differential resistance becoming negative in NDR regime 504(a).

Depending on the overdrive-voltage (differential voltage beyond the threshold voltage) applied to selector device 206, selector device 206 may settle down to various low-resistance states, or ON-state regimes 506(a) (described below). ON-state regime 506(a) may be completely volatile (corresponding to a volatile filament 406), and selector device 206 may revert to OFF-state regime 508(a) (filament 406 dissolved), once the voltage is removed. The voltage and current associated with this reversal and dissolution of filament 406 is designated as the holding voltage $V_h$ and holding current $I_h$. Thus, when a voltage across selector device 206 falls below $V_h$, filament 406 is dissolved.

Figure 5C:
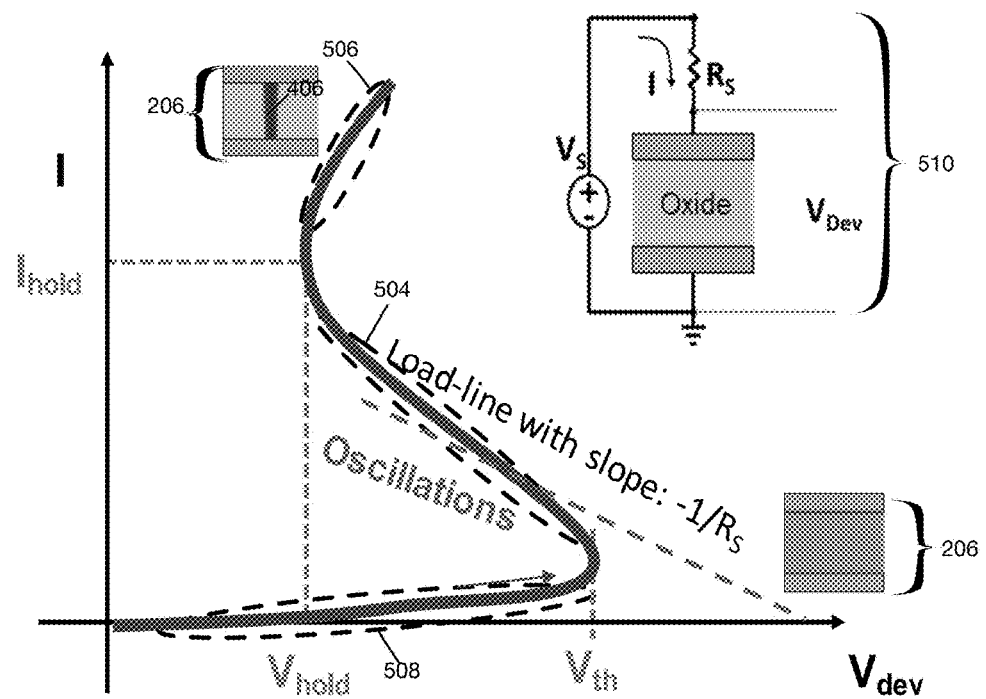
FIG. 5c shows an I-V curve of a selector device in relation to an ON-state and an OFF-state along with associated presence or non-presence of a filament according to one embodiment of the present disclosure.

FIG. 5c shows an I-V curve of a selector device in relation to an ON-state and an OFF-state along with associated presence or non-presence of a filament according to one embodiment of the present disclosure. As shown in FIG. 5c, the I-V curve exhibits S-type negative differential resistance. The term S-type refers to the fact that the I-V curve is shaped like the letter 'S'. For purposes of this discussion, differential resistance will be understood to be the derivative of the voltage with respect to the current $$r_{diff} = \frac{dv}{di}.$$

Points on the I-V curve where the slope is negative indicate that an increase in voltage results in a decrease in current, thus defining a negative differential resistance ($r_{diff}$<0).

FIG. 5c shows three distinct regions of operation, ON-state 506 characterized by low voltage, high current and low resistance (high conductivity), OFF-state 508 characterized by high voltage, low current and high resistance (low conductivity) and negative differential ("NDR") region 504, which is unstable. NDR region 504 may be understood as exhibiting a negative resistance in that I-V curves in those regions exhibit a decreasing current as the voltage is increased.

In particular, FIG. 5c shows an I-V curve characterizing the state change across selector device 206 induced by varying voltage $V_s$ across resistor-selector pair 510. As shown in FIG. 5c, OFF-state 508, characterized by a high resistance/low conductivity state may occur when $V_{DEV}$ falls below $V_t$. Note the absence of a filament 406 in selector device 206 while in OFF-state 508. As the voltage across selector-device 206 is increased and eventually exceeds $V_t$, selector device 206 may enter ON-state 506 characterized by low resistance/high conductivity. This high conductivity state 506 may be caused due to formation of filament 406 in selector device 206. The transition between OFF-state 508 and ON-state 506 may occur via NDR state 504. Once selector device 206 is in ON-state 506, it may remain in such state until the voltage across selector device 206 falls below $V_h$, in which case, selector device 206 may transition to OFF-state 508 via dissolution of filament 406.

Figure 5D:
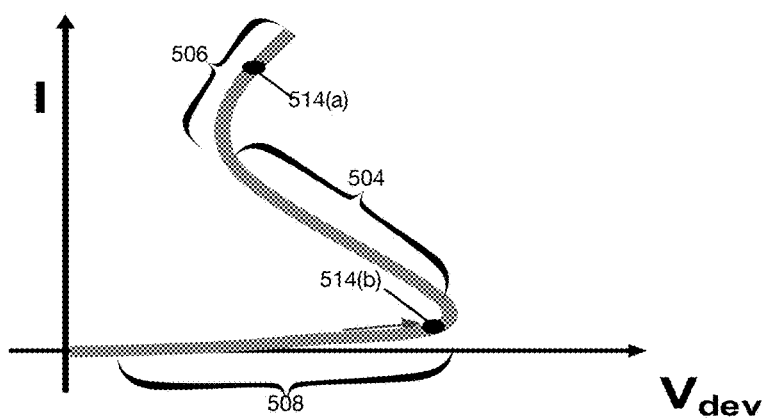
FIG. 5d shows an I-V curve of a selector device with respect to two particular operating points according to one embodiment of the present disclosure.

FIG. 5d shows an I-V curve of a selector device 206 with respect to two particular operating points according to one embodiment of the present disclosure. As shown in FIG. 5d, selector device 206 may operate in ON-state 506 at operating point 514(a) and transition to OFF-state 508 at operating point 514(b) via NDR regime 504. Thus, operating points 514(a)-514(b) may describe two discrete states (ON and OFF) for operation of selector device 206.

According to one embodiment, NDR region 504 resistance allows two states (ON-state 506 and OFF-state 508), each of which is activated or deactivated at different voltages. To exhibit a change in voltage without change in current, NDR region 504 is necessary. The I-V curve shown in FIG. 5d may exhibit a snap-back behavior, which is facilitated by NDR region 504. In particular, this behavior allows selector device 206 to exhibit a change in voltage without a corresponding change in current in order to maintain two states.

Figure 5E:
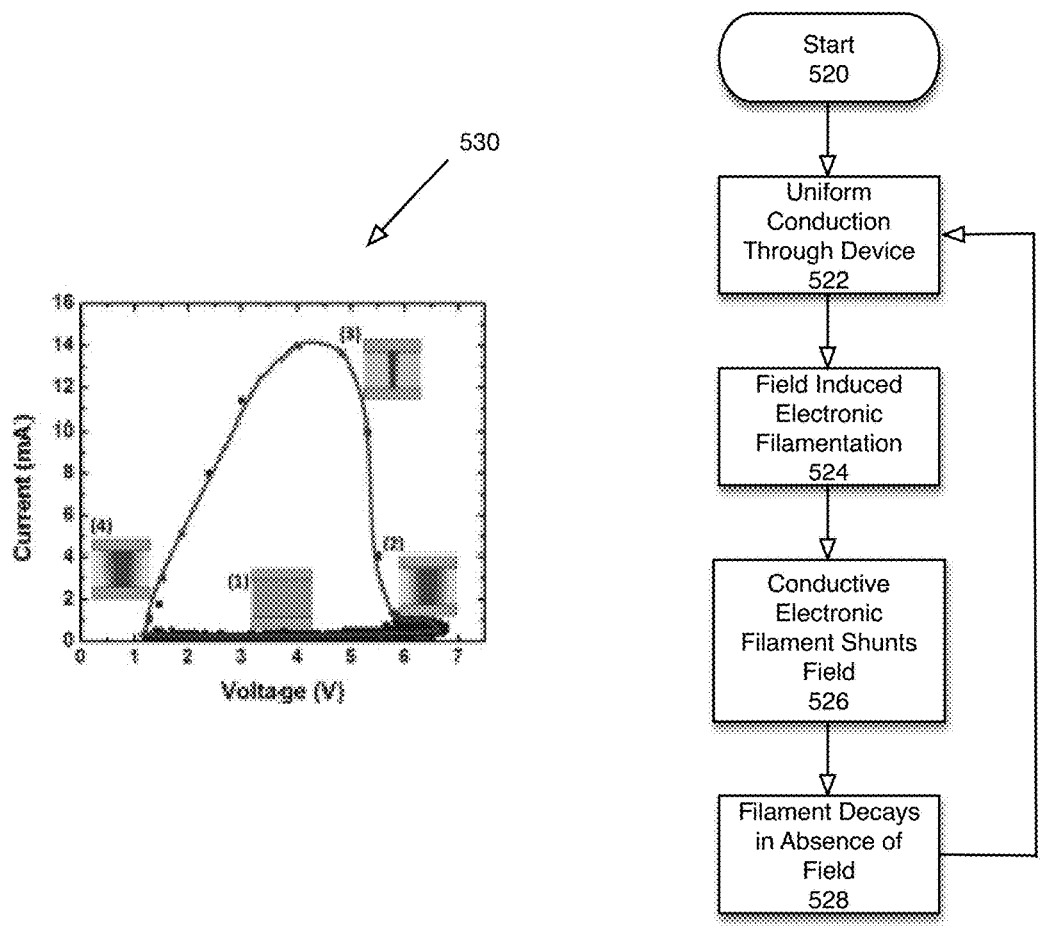
FIG. 5e is a flowchart depicting an oscillatory cycle of a selector device, and corresponding phase diagram, according to one embodiment of the present disclosure.

FIG. 5e is a flowchart depicting an oscillatory cycle of a selector device according to one embodiment of the present disclosure. The flowchart shown in FIG. 5e corresponds to phase diagram 530. As shown in FIG. 5e, the process is initiated in 520. In 522, the selector device 206 exhibits uniform conduction. In 524, a filament 406 may be induced in the selector device 206 due to the introduction of an external field and associated voltage that exceeds $V_t$. In 526, the induced conductive electronic filament 406 shunts the electric field, thereby reducing the voltage across the selector device 206 and the voltage across the selector device 206 begins to decline. In 528, once the voltage across the selector device 206 falls below $V_h$, the filament 406 decays thereby increasing the resistivity of the selector device 206. In this case, the voltage across the selector device 206 may begin to rise again. Flow then continues with 522 and the cycle is repeated.

Figure 5F:
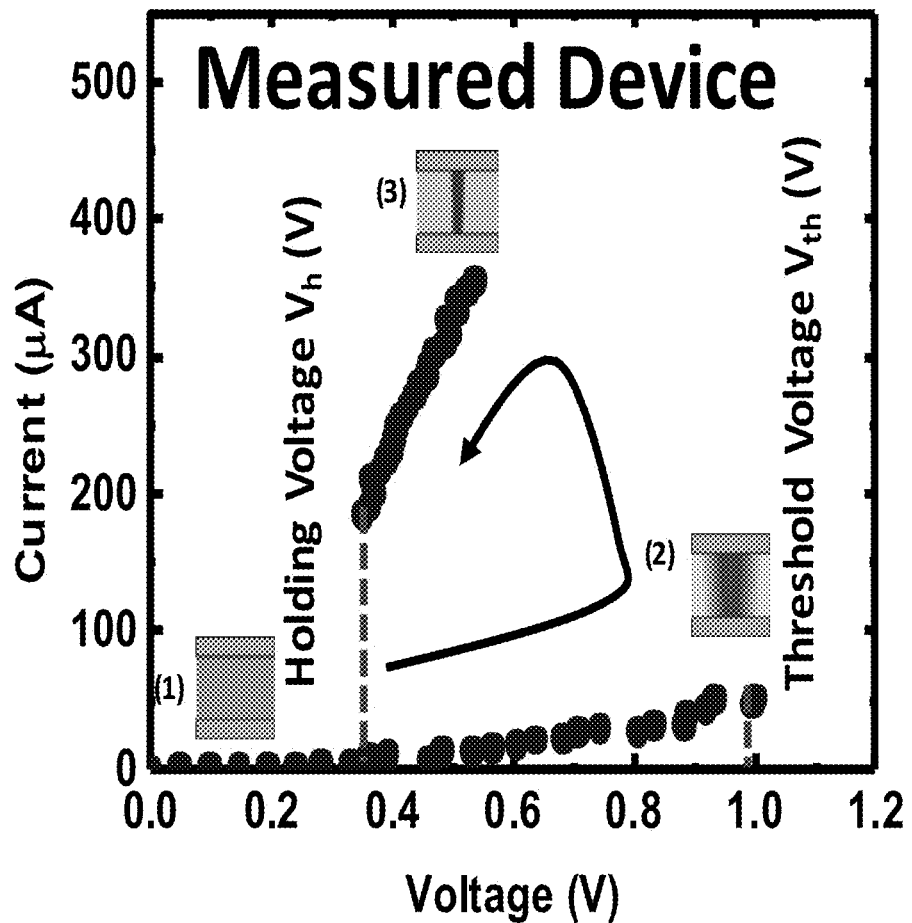
FIG. 5f shows data points of an I-V curve of a selector device in respective ON and OFF states according to one embodiment of the present disclosure.

FIG. 5f shows data points of an I-V curve of a selector device in respective ON and OFF states according to one embodiment of the present disclosure.

Figure 5G:
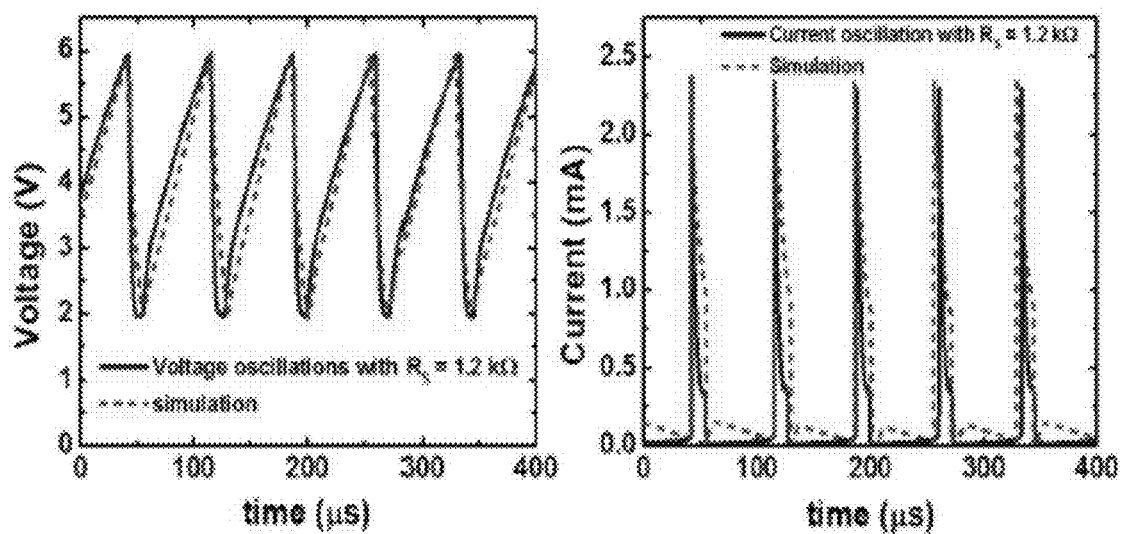
FIG. 5g illustrates time-domain voltage and current waveforms of oscillatory behavior of a selector device-resistance pair between an ON-state and an OFF-state according to one embodiment of the present disclosure.

FIG. 5g illustrates time-domain voltage and current waveforms of oscillatory behavior of a selector device-resistance pair between an ON-state and an OFF-state according to one embodiment of the present disclosure. As shown in FIG. 5g, once selector device 206 switches to ON-state 506(a) (temporary low-resistance state), the resistance of selector device 206 experiences a rapid decrease. Due to the voltage division enforced by the resistance in series, the voltage across selector device 206 drops. This drives selector device 206 to an I-V point in ON-state regime 506 that is lower than the holding voltages $V_h$ and the current $I_h$. Thus, conductive filament 406 is unstable and thus dissolves, driving selector device 206 back to OFF-state 508. Once in the high-resistance state, the voltage across selector device 206 starts increasing, eventually exceeding the threshold voltage, which causes selector device 206 to go back to ON-state 506. Thus, selector device 206 may undergo sustained oscillations between ON-state regime 506 and OFF-state regime 508.

While oscillatory behavior for selector device 206 has been described, if the source voltage $V_s$ exceeds a threshold voltage, oscillations may be suppressed. In particular, if $V_s > V_{osc-thresh}$, no sustained oscillations will occur and selector device 206 may be utilized in VFMC 200 to store a sustained state. fashion. This controlled behavior may be leveraged to write or read binary data to VFMC 200.

Figure 6A:
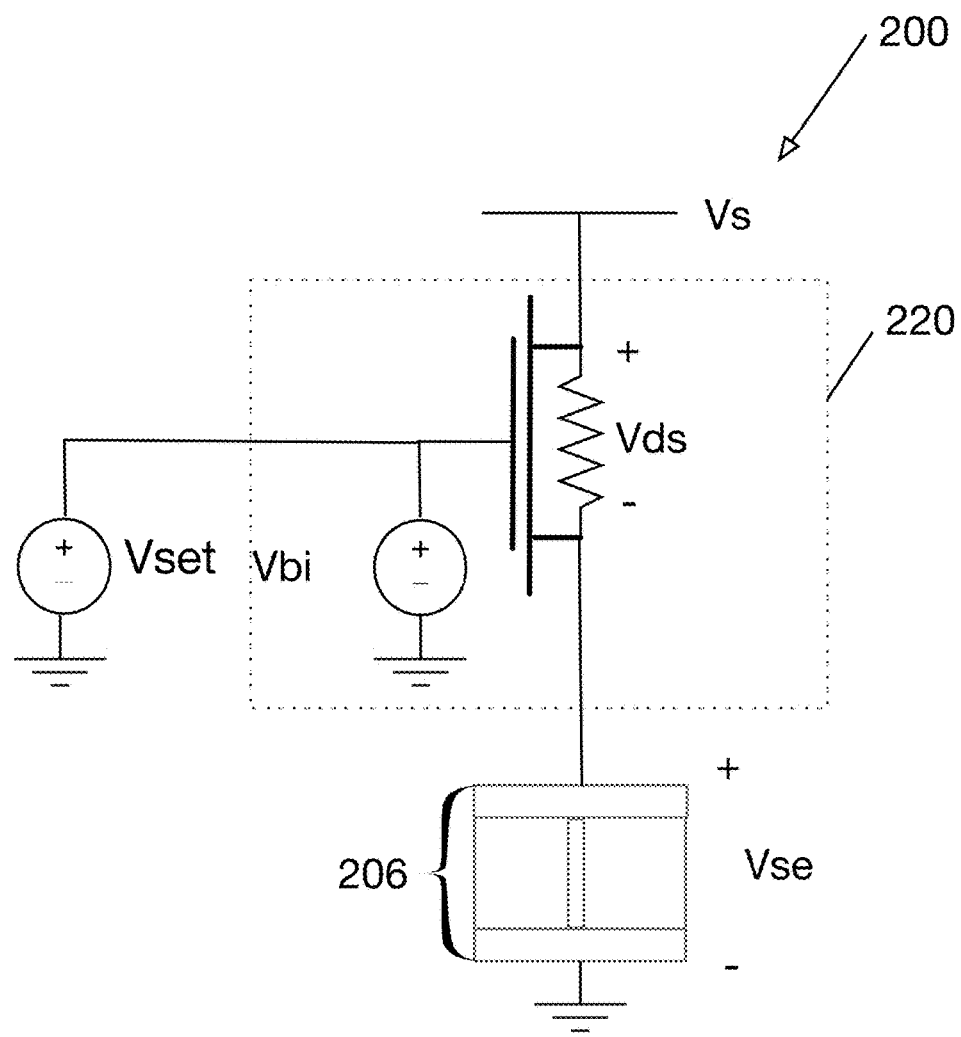
FIG. 6a is a schematic of a compact ferroelectric memory cell according to one embodiment of the present disclosure.

FIG. 6a is a schematic of a compact ferroelectric memory cell according to one embodiment of the present disclosure. The schematic shown in FIG. 6a depicts how 1S-1T CFMC 200 may store a value (i.e., a digital '0' or digital '1'). During a write phase, a built-in voltage $V_{bi}$ may be established at gate oxide 202 of FGVT 220 by applying a large positive voltage $V_{set}$. As previously described, $V_{bi}$ and an associated $Q_{bi}$ (built-in charge) may be induced by applying a coercive voltage to the gate 102 of FGVT 220 such that the polarization of ferroelectric layer 204 assumes either an anti-parallel or parallel state. In particular, a parallel polarization state may be induced in ferroelectric layer 204 by applying a large positive voltage (coercive voltage) at gate 102. Conversely, an anti-parallel polarization state may be induced in ferroelectric layer 204 by applying a large negative voltage (coercive voltage) at gate 102.

If $V_{bi} > V_t$ of FGVT 220, FGVT 220 will turn on and the source drain conductance will increase. Thus, in this on state, due to the voltage-divider effect across the channel 232 of FGVT 220 and selector device 206, most of the voltage $V_s$ will fall across selector device 206, causing it on enter ON-state 506. Conversely, if $V_{bi} < V_t$ of FGVT 220, FGVT 220 will turn off and the source drain conductance will decrease to near zero. Thus, in this off state, due to the voltage-divider effect across the channel 232 of FGVT 220 and selector device, most of the voltage $V_s$ will fall across the channel 232 of FGVT 220 and only a small voltage will fall across selector device 206, causing it on enter OFF-state 508.

A binary value may be represented by the state of selector device 206 as either in ON-state 506 or OFF-state 506. Thus, to set the state of 1S-1T CFMC 200 to ON-state 506, a large positive coercive voltage may be applied to the gate 102 of FGVT 220 resulting in a remanent polarization state inducing a positive $V_{bi}$ in gate oxide 202. On the other hand, in order to set the state of 1S-1T CFMC 200 to OFF-state 508, a large negative coercive voltage may be applied to the gate 102 of FGVT 220 resulting in a remanent polarization state inducing a negative $V_{bi}$ in gate oxide 202.

Figure 6B:
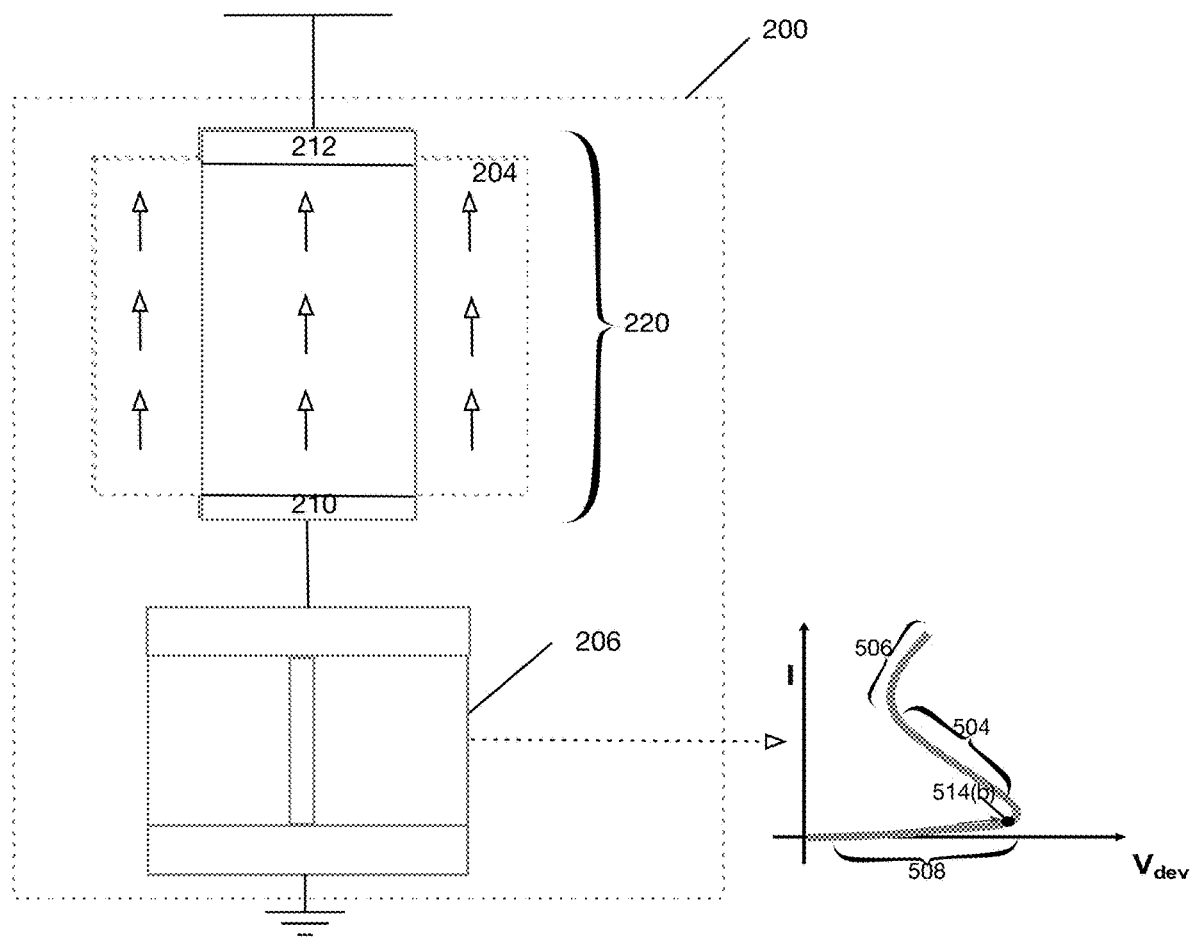
FIG. 6b is a schematic of a compact ferroelectric memory cell in an OFF-state according to one embodiment of the present disclosure.

FIG. 6b is a schematic of a compact ferroelectric memory cell in an OFF-state according to one embodiment of the present disclosure.

Figure 6C:
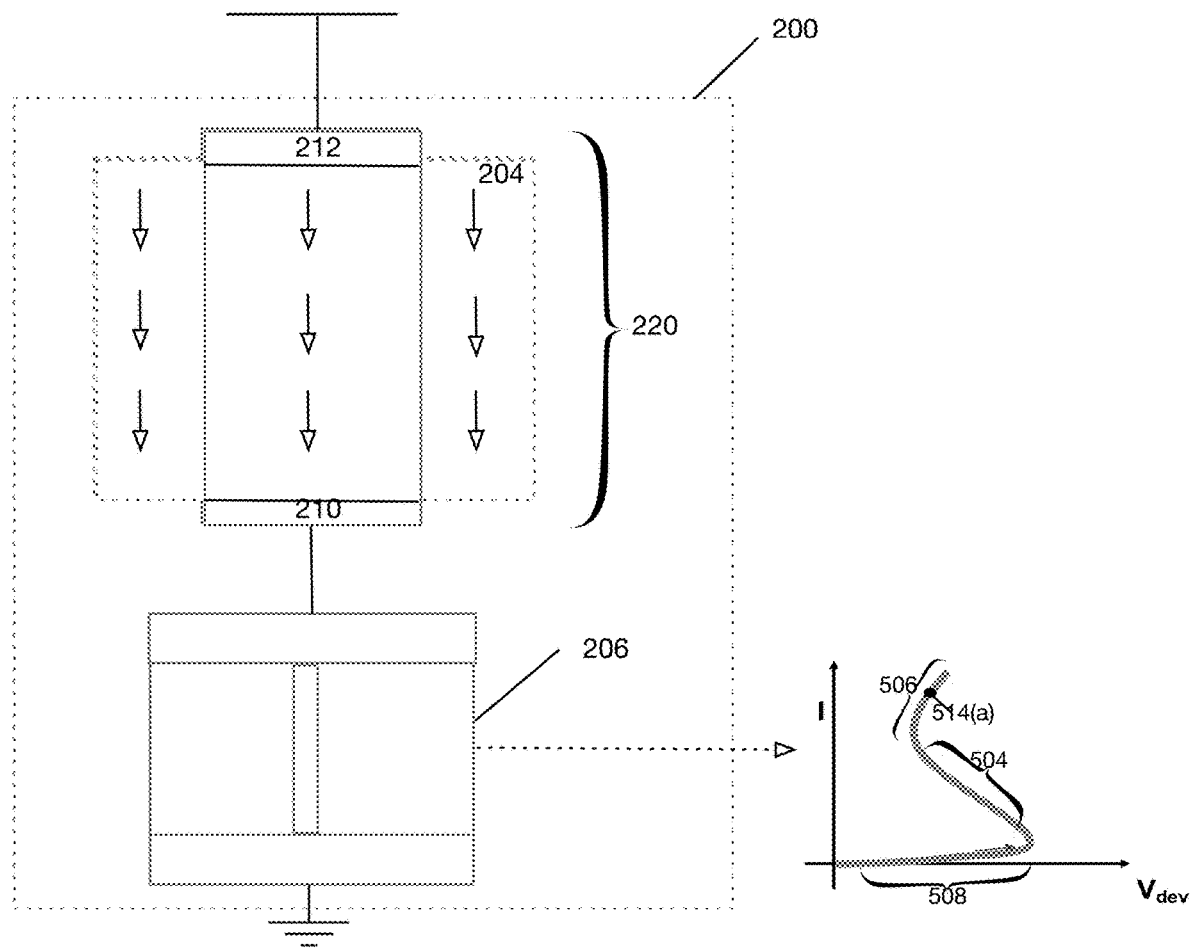
FIG. 6c depicts a compact ferroelectric memory cell in an ON-state according to one embodiment of the present disclosure.

FIG. 6c depicts a compact ferroelectric memory cell in an ON-state according to one embodiment of the present disclosure.

Figure 6D:
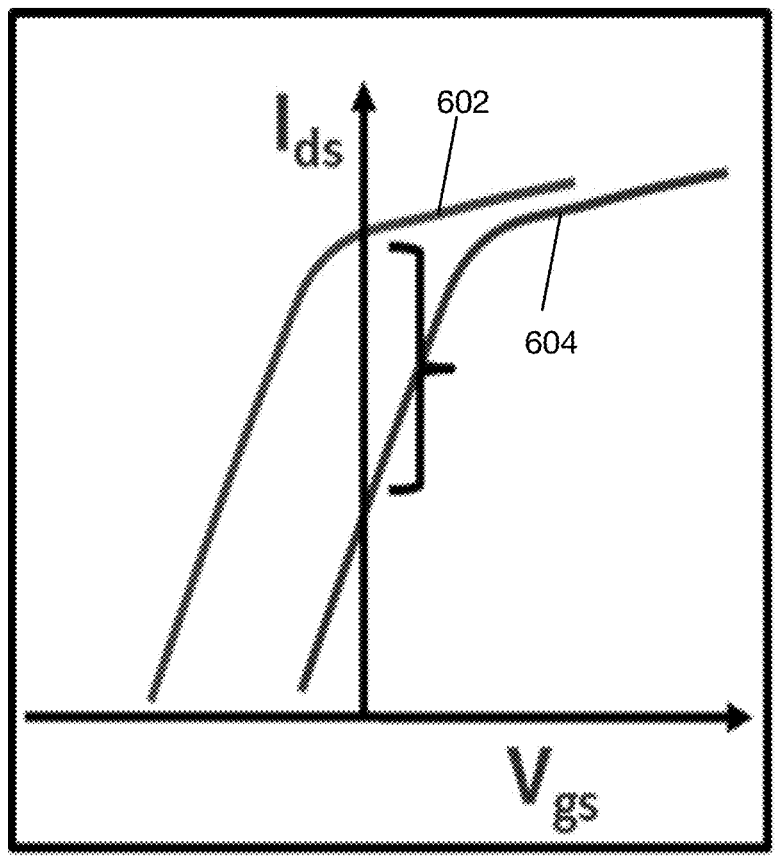
FIG. 6d shows two I-V curves for a FGVT in log scale in the vertical dimension according to one embodiment of the present disclosure.

FIG. 6d shows two I-V curves for a FGVT in log scale in the vertical dimension according to one embodiment of the present disclosure. FIG. 6d shows high conductance I-V curve 602 corresponding to an ON-state of FGVT 220 and high resistance (low conductance) I-V curve 604 corresponding to an OFF state of FGVT 220. In particular, I-V curves 602 and 604 correspond to two different threshold voltages $V_t$ of FGVT 220. This may be understood as follows. The built-in $Q_{bi}$ charge at gate oxide 202 effectively modulates the threshold voltage $V_t$ of FGVT 220. That is the presence of $Q_{bi}$ in gate oxide 202 acts as if a gate voltage were being applied to FGVT 220 modulating $V_t$ to $V_{t-eff}$. Thus, the drain to source conductance of FGVT 220 can be highly conductive (I-V curve 602) meaning $V_{t-eff} < 0$ or highly resistive (I-V curve 604) meaning that $V_t > 0$. Thus, the effective threshold voltage $V_{t-eff}$ associated with I-V curve 604 is higher than $V_{t-eff}$ of I-V 602 due to the fact that $V_{t-eff} < 0$ for curve 604 (i.e., a higher gate voltage is required for I-V curve 604 to turn on FGVT 220). Correspondingly, I-V curve 602 indicates that FGVT 220 turns on at an even lower voltage.

The presence of ferroelectric material allows for switching between I-V curves 602 and 604 by changing the polarization state of ferroelectric layer 204 from a parallel to an anti-parallel state. In particular, assuming, for example, $Q_{bi} > 0$, this is effectively applying a pre-existing positive charge in gate oxide 202. This positive charge is not applied externally, but is due to the polarization state of ferroelectric layer (anti-parallel) 204. In effect, FGVT 220 "sees" an effective $V_{gs}$ due to the state of ferroelectric layer 204. This situation corresponds to I-V curve 602 (i.e., conductive—high current at 0 bias) and $V_{t-eff} < 0$.

Conversely, if $Q_{bi} < 0$, this is effectively applying a pre-existing negative charge on the gate of FGVT 220. This effectively causes $V_{t-eff} > 0$. Thus, in this situation, in order to turn on FGVT 220, a very high voltage would need to be applied at the gate 102. In other words, a very high voltage would be required to compensate for the negative potential and an even higher voltage would be required to turn on FGVT 220. This negative charge is not applied externally, but is due to the polarization state of ferroelectric layer (parallel) 204.

Thus, at 0 bias, for example, either a highly conductive drain to source impedance of FGVT 220 (I-V curve 602) or a highly resistive drain to source impedance (i.e., channel 232 conductivity) of FGVT 220 (I-V curve 604) may be selected by changing the polarization state (parallel or anti-parallel) of ferroelectric layer 204. It will be understood that $V_{DS}$ is held constant and the resistance $$R_{DS} = \frac{V_{DS}}{I_{DS}}.$$

FIG. 6d also indicates how a write operation can be performed for 1S-1T CFMC 200. A high positive $V_{GS}$ will place 1S-1T CFMC 200 on I-V curve 602. Conversely, a high negative $V_{GS}$ will place 1S-1T CFMC 200 on I-V curve 604.

Figure 7A:
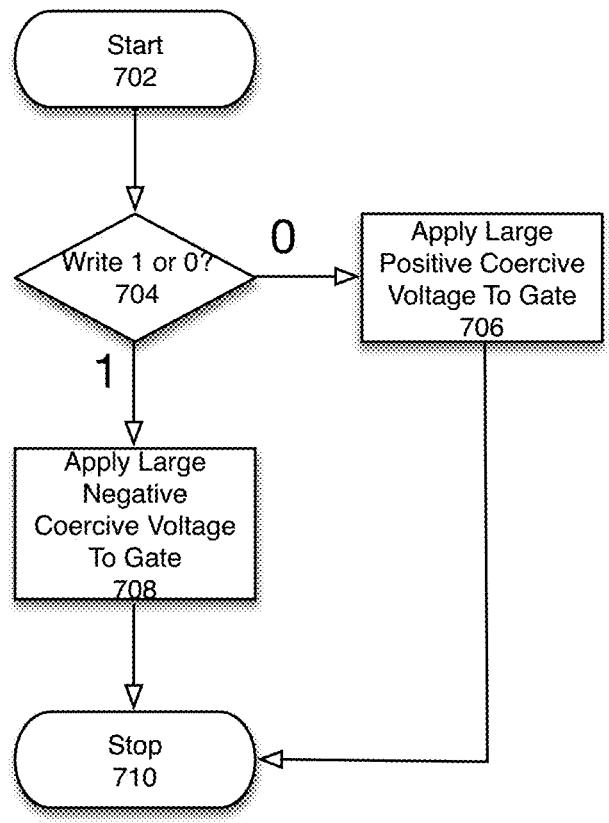
FIG. 7a is a flowchart depicting a technique for writing to a compact ferroelectric memory cell according to one embodiment of the present disclosure.

FIG. 7a is a flowchart depicting a technique for writing to a compact ferroelectric memory cell according to one embodiment of the present disclosure. The process is initiated in 702. In 704 it is determined whether a digital '0' or '1' is to be written. If a '0' is to be written ('0' branch of 704), in 708, a large negative coercive voltage is applied to gate 102 of FGVT 220. If a '1' is to be written ('1' branch of 704), in 706 a large positive coercive voltage is applied to gate 102 of FGVT 220. The process ends in 710.

Figure 7B:
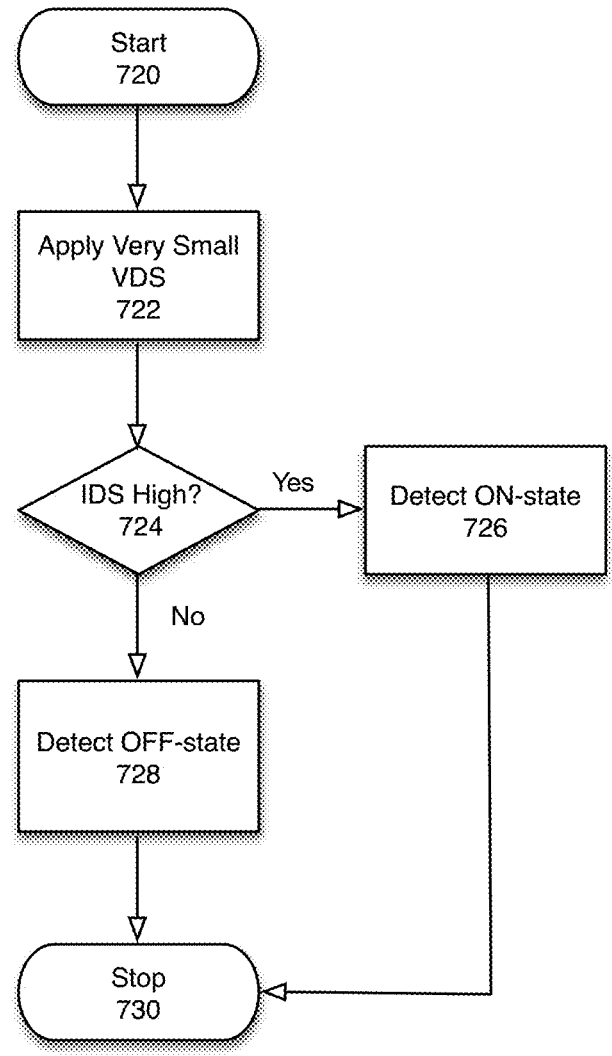
FIG. 7b is a flowchart depicting a technique for reading from a compact ferroelectric memory cell according to one embodiment of the present disclosure.

FIG. 7b is a flowchart depicting a technique for reading from a compact ferroelectric memory cell according to one embodiment of the present disclosure. Referring again to FIG. 6d, a very small $V_{DS}$ may be applied to the drain to source of FGVT 220. Depending on the state of ferroelectric layer 204, $I_{DS}$ will either be at the intersection of I-V curve 602 with the vertical axis or the intersection of I-V curve 604 with the vertical axis. As previously discussed, these will be very different currents differing by orders of magnitudes (note that FIG. 6d shows a vertical axis on a log scale).

Referring to FIG. 7b, the read process is initiated in 720. In 722, a very small $V_{DS}$ is applied between the drain and source of FGVT 220. In 724, $I_{DS}$ is measured. If $I_{DS}$ is high ('Yes' branch of 724, in 726 an ON-state is detected. On the other hand, if $I_{DS}$ is low ('No branch of 724, in 728 an OFF-state is detected. The process ends in 730.

Figure 8:
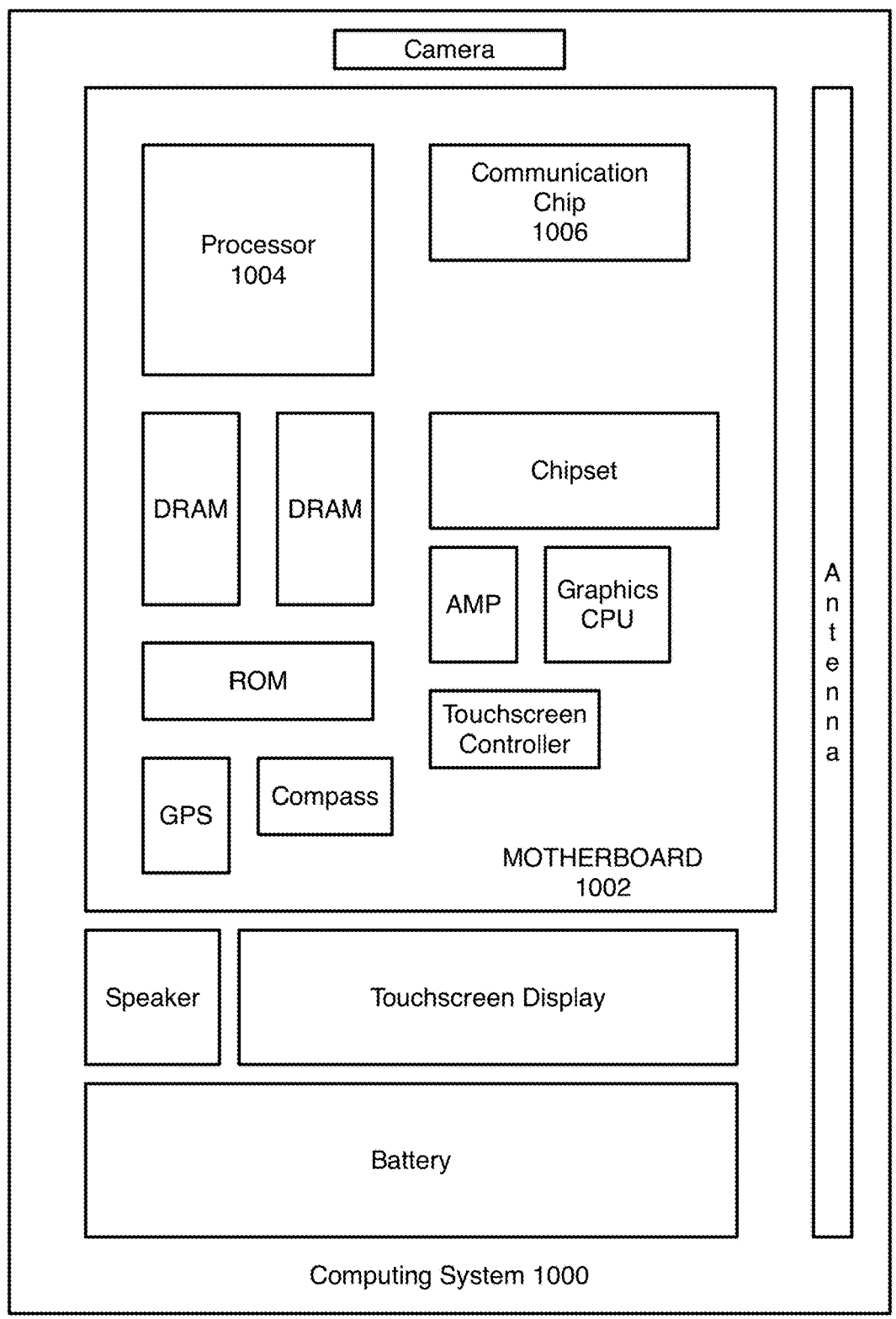
FIG. 8 illustrates a computing system implemented with integrated circuit structures and/or transistor devices formed using the techniques disclosed herein, in accordance with some embodiments of the present disclosure.

FIG. 8 illustrates a computing system implemented with integrated circuit structures and/or transistor devices formed using the techniques disclosed herein, in accordance with some embodiments of the present disclosure. Computing system 1000 may employ a number of 1S-1T CFMCs 200, or other back-end memory cells as provided herein. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices configured in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices configured as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices configured as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1 is a memory cell comprising: a vertical transistor and a two-terminal selector device. The vertical transistor includes a metal gate node, a gate oxide layer, a ferroelectric material layer, a semiconductor layer, a drain node electrically coupled to said semiconductor layer, and a source node electrically coupled to said semiconductor layer. The two-terminal selector device exhibits a voltage-dependent volatile resistance state change, wherein a first terminal of said selector device is electrically coupled to said drain node. The memory cell may selectively be operated in one of an ON-state and an OFF-state depending upon a polarization state of ferroelectric material of said ferroelectric material layer.

Example 2 includes the subject matter of Example 1, wherein said voltage-dependent volatile resistance state change occurs between a first state of said selector device and a second state of said selector device and a first binary value is represented by said first state and a second binary value is represented by said second state.

Example 3 includes the subject matter of Example 1 or 2, wherein a write operation may be performed upon said memory cell to store a first binary value by setting a gate node voltage to a positive value greater than a first threshold value and a second binary value by setting said gate node voltage to a negative value less than a second threshold value.

Example 4 includes the subject matter of Example 3, wherein setting said gate node voltage to a positive value greater than said first threshold value causes said ferroelectric material to assume a first polarization state and setting said gate node voltage to a negative value less than said second threshold value causes said ferroelectric material to assume a second polarization state.

Example 5 includes the subject matter of Example 4, wherein said first polarization state causes a first built-in voltage to be established at said gate node of said vertical transistor and said second polarization state causes a second built-in voltage to be established at said gate oxide layer of said vertical transistor.

Example 6 includes the subject matter of Example 5, wherein said first built-in voltage causes a high conductivity between said source node and said drain node and said second built-in voltage causes a high resistivity between said source node and said drain node.

Example 7 includes the subject matter of any of the preceding Examples, wherein a voltage divider between said vertical transistor and said two-terminal selector device causes said selector device to be in an on state when a high conductivity is established between said source node and said drain node and said selector device to be in an off state when a high resistivity is established between said source node and said drain node. Note that the voltage divider includes a first resistance provided by the vertical transistor and a second resistance provided by the selector device.

Example 8 includes the subject matter of any of the preceding Examples, wherein a read operation may be performed by applying a low voltage between said source node and said drain node and reading a current between said source node and said drain node.

Example 9 is an integrated circuit comprising the memory cell of any of the preceding Examples. The integrated circuit may be, for instance, a processor or a communication chip or chip-set or a memory chip. In still further examples, a computing system includes the integrated circuit comprising said memory cell.

Example 10 is a memory cell comprising: a transistor including a ferroelectric layer coupled to a gate oxide layer and a gate node coupled to said gate oxide layer; and a selector device that exhibits a voltage-dependent volatile resistance state change, coupled in series with said transistor; wherein said memory cell may selectively be operated in one of an ON-state and an OFF-state depending upon a polarization state of ferroelectric material of said ferroelectric layer.

Example 11 includes the subject matter of Example 10, wherein said voltage-dependent volatile resistance state change occurs between a first state of said selector device and a second state of said selector device and a first binary value is represented by said first state and a second binary value is represented by said second state.

Example 12 includes the subject matter of Example 10 or 11, wherein a write operation may be performed upon said memory cell to store a first binary value by setting a gate node voltage to a positive value greater than a first threshold value and a second binary value by setting said gate node voltage to a negative value less than a second threshold value.

Example 13 includes the subject matter of Example 12, wherein setting said gate node voltage to a positive value greater than said first threshold value causes said ferroelectric material to assume a first polarization state and setting said gate node voltage to a negative value less than said second threshold value causes said ferroelectric material to assume a second polarization state.

Example 14 includes the subject matter of Example 13, wherein said first polarization state causes a first built-in voltage to be established at said gate oxide layer of said transistor and said second polarization state causes a second built-in voltage to be established at said gate oxide layer of said transistor.

Example 15 includes the subject matter of Example 14, wherein said transistor further comprises a source node and a drain node and said first built-in voltage causes a high conductivity between said source node and said drain node and said second built-in voltage causes a high resistivity between said source node and said drain node.

Example 16 includes the subject matter of Example 15, wherein a voltage divider between said transistor and said two-terminal selector device causes said selector device to be in an on state when a high conductivity is established between said source node and said drain node and said selector device to be in an off state when a high resistivity is established between said source node and said drain node.

Example 17 includes the subject matter of Example 15 or 16, wherein a read operation may be performed by applying a low voltage between said source node and said drain node and reading a current between said source node and said drain node.

Example 18 is an integrated circuit comprising the memory cell of any of Examples 10 through 17.

Example 19 is a computing system comprising: a motherboard, wherein said motherboard includes a processor, a communication chip, and a memory cell. The memory cell includes a transistor including a ferroelectric layer coupled to a gate oxide layer and a gate node coupled to said gate oxide layer; a selector device that exhibits a voltage-dependent volatile resistance state change, coupled in series with said transistor; wherein said memory cell may selectively be operated in one of an ON-state and an OFF-state depending upon a polarization state of ferroelectric material of said ferroelectric layer.

Example 20 includes the subject matter of Example 19, wherein said voltage-dependent volatile resistance state change occurs between a first state of said selector device and a second state of said selector device and a first binary value is represented by said first state and a second binary value is represented by said second state.

Example 21 includes the subject matter of Example 19 or 20, wherein a write operation may be performed upon said memory cell to store a first binary value by setting a gate node voltage to a positive value greater than a first threshold value and a second binary value by setting said gate node voltage to a negative value less than a second threshold value.

Example 22 includes the subject matter of Example 21, wherein setting said gate node voltage to a positive value greater than said first threshold value causes said ferroelectric material to assume a first polarization state and setting said gate node voltage to a negative value less than said second threshold value causes said ferroelectric material to assume a second polarization state.

Example 23 is an integrated circuit memory cell, comprising: a transistor that exhibits a low conductive state and a high conductive state; and a two-terminal selector device that exhibits one of an ON-state and an OFF-state depending upon whether the transistor is in its said low conductive state or said high conductive state; wherein said memory cell may selectively be operated in one of an ON-state and an OFF-state depending upon whether the selector device is in its ON-state or OFF-state.

Example 24 includes the subject matter of Example 23, wherein a first binary value is represented by said ON-state of said memory cell and a second binary value is represented by said OFF-state of said memory cell.

Example 25 includes the subject matter of Example 23 or 24, wherein a write operation may be performed upon said memory cell to store a first binary value by setting a gate node voltage at the transistor to a positive value greater than a first threshold value and a second binary value by setting said gate node voltage to a negative value less than a second threshold value.

Example 26 includes the subject matter of Example 25, wherein setting said gate node voltage to a positive value greater than said first threshold value causes a ferroelectric material of said transistor to assume a first polarization state and setting said gate node voltage to a negative value less than said second threshold value causes said ferroelectric material to assume a second polarization state.

Example 27 includes the subject matter of Example 26, wherein said first polarization state causes a first built-in voltage to be established at a gate oxide layer of said transistor and said second polarization state causes a second built-in voltage to be established at said gate oxide layer.

Example 28 includes the subject matter of Example 27, wherein said transistor includes a source node and a drain node, and said first built-in voltage causes a high conductivity between said source node and said drain node, and said second built-in voltage causes a high resistivity between said source node and said drain node.

Example 29 includes the subject matter of Example 28, wherein a read operation may be performed by applying a low voltage between said source node and said drain node and reading a current between said source node and said drain node.

Example 30 includes the subject matter of any of Examples 23 through 29, wherein said selector device is in its said ON-state when said transistor is in said high conductive state, and said selector device is in its said OFF-state when said transistor is in said low conductive state.

The foregoing description of example embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. A memory cell comprising:
   a vertical transistor, wherein said vertical transistor includes a metal gate node, a gate oxide layer, a ferroelectric material layer, a semiconductor layer, a drain node electrically coupled to said semiconductor layer, and a source node electrically coupled to said semiconductor layer, wherein the ferroelectric material layer is between the gate oxide layer and the semiconductor layer, and wherein the ferroelectric material layer is in contact with both the gate oxide layer and the semiconductor layer; and
   a two-terminal selector device that exhibits a voltage-dependent volatile resistance state change, wherein a first terminal of said two-terminal selector device is electrically coupled to said drain node;
   wherein said memory cell is configured to operate in one of an ON-state and an OFF-state depending upon a polarization state of a ferroelectric material of said ferroelectric material layer.

2. The memory cell according to claim 1, wherein said voltage-dependent volatile resistance state change occurs between a first state of said two-terminal selector device and a second state of said two-terminal selector device and a first binary value is represented by said first state and a second binary value is represented by said second state.

3. The memory cell according to claim 1, wherein a write operation may be performed upon said memory cell to store a first binary value by setting a gate node voltage to a positive value greater than a first threshold value and a second binary value by setting said gate node voltage to a negative value less than a second threshold value.

4. The memory cell according to claim 3, wherein setting said gate node voltage to a positive value greater than said first threshold value causes said ferroelectric material to assume a first polarization state and setting said gate node voltage to a negative value less than said second threshold value causes said ferroelectric material to assume a second polarization state.

5. The memory cell according to claim 4, wherein said first polarization state causes a first built-in voltage to be established at said gate node of said vertical transistor and said second polarization state causes a second built-in voltage to be established at said gate oxide layer of said vertical transistor.

6. The memory cell according to claim 5, wherein said first built-in voltage causes a high conductivity between said source node and said drain node and said second built-in voltage causes a high resistivity between said source node and said drain node.

7. The memory cell according to claim 1, wherein a voltage divider between said vertical transistor and said two-terminal selector device causes said two-terminal selector device to be in an on state when a high conductivity is established between said source node and said drain node and said two-terminal selector device to be in an off state when a high resistivity is established between said source node and said drain node.

8. The memory cell according to claim 1, wherein a read operation may be performed by applying a low voltage between said source node and said drain node and reading a current between said source node and said drain node.

9. An integrated circuit comprising the memory cell of claim 1.

10. A memory cell comprising:
a vertical transistor including a ferroelectric layer coupled to a gate oxide layer over a semiconductor layer, and a gate node coupled to said gate oxide layer, wherein the ferroelectric layer is between the gate oxide layer and the semiconductor layer, and wherein the ferroelectric material layer is in contact with both the gate oxide layer and the semiconductor layer; and
a selector device that exhibits a voltage-dependent volatile resistance state change, coupled in series with said vertical transistor;
wherein said memory cell is configured to operate in one of an ON-state and an OFF-state depending upon a polarization state of a ferroelectric material of said ferroelectric layer.

11. The memory cell according to claim 10, wherein said voltage-dependent volatile resistance state change occurs between a first state of said selector device and a second state of said selector device and a first binary value is represented by said first state and a second binary value is represented by said second state.

12. The memory cell according to claim 10, wherein a write operation may be performed upon said memory cell to store a first binary value by setting a gate node voltage to a positive value greater than a first threshold value and a second binary value by setting said gate node voltage to a negative value less than a second threshold value.

13. The memory cell according to claim 12, wherein setting said gate node voltage to a positive value greater than said first threshold value causes said ferroelectric material to assume a first polarization state and setting said gate node voltage to a negative value less than said second threshold value causes said ferroelectric material to assume a second polarization state.

14. The memory cell according to claim 13, wherein said first polarization state causes a first built-in voltage to be established at said gate oxide layer of said vertical transistor and said second polarization state causes a second built-in voltage to be established at said gate oxide layer of said vertical transistor.

15. The memory cell according to claim 14, wherein said vertical transistor further comprises a source node and a drain node and said first built-in voltage causes a high conductivity between said source node and said drain node and said second built-in voltage causes a high resistivity between said source node and said drain node.

16. The memory cell according to claim 15, wherein a voltage divider between said vertical transistor and said selector device causes said selector device to be in an on state when a high conductivity is established between said source node and said drain node and said selector device to be in an off state when a high resistivity is established between said source node and said drain node.

17. The memory cell according to claim 15, wherein a read operation may be performed by applying a low voltage between said source node and said drain node and reading a current between said source node and said drain node.

18. An integrated circuit memory cell, comprising:
a vertical transistor that exhibits a low conductive state and a high conductive state, wherein said vertical transistor includes a gate node, a gate oxide layer, a ferroelectric material layer, and a semiconductor layer, and wherein the ferroelectric material layer is between the gate oxide layer and the semiconductor layer, and wherein the ferroelectric material layer is in contact with both the gate oxide layer and the semiconductor layer; and
a two-terminal selector device that exhibits one of an ON-state and an OFF-state depending upon whether the vertical transistor is in its said low conductive state or said high conductive state;
wherein said memory cell is configured to operate in one of an ON-state and an OFF-state depending upon whether the selector device is in its ON-state or OFF-state.

19. The integrated circuit memory cell according to claim 18, wherein a write operation may be performed upon said memory cell to store a first binary value by setting a gate node voltage at the vertical transistor to a positive value greater than a first threshold value and a second binary value by setting said gate node voltage to a negative value less than a second threshold value.

20. The integrated circuit memory cell according to claim 19, wherein setting said gate node voltage to a positive value greater than said first threshold value causes a ferroelectric material of said vertical transistor to assume a first polarization state and setting said gate node voltage to a negative value less than said second threshold value causes said ferroelectric material to assume a second polarization state.

* * * * *